United States Patent
Higashira et al.

(10) Patent No.: US 11,856,695 B2
(45) Date of Patent: Dec. 26, 2023

(54) METHOD FOR FORMING THROUGH-HOLE, AND SUBSTRATE FOR FLEXIBLE PRINTED WIRING BOARD

(71) Applicant: NIPPON MEKTRON, LTD., Tokyo (JP)

(72) Inventors: Toshihiro Higashira, Tokyo (JP); Fuki Hatano, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/494,141

(22) Filed: Oct. 5, 2021

(65) Prior Publication Data

US 2022/0117085 A1 Apr. 14, 2022

(30) Foreign Application Priority Data

Oct. 12, 2020 (JP) .................................. 2020-171937

(51) Int. Cl.
*H05K 1/02* (2006.01)
*H05K 1/11* (2006.01)
(Continued)

(52) U.S. Cl.
CPC ........... *H05K 1/115* (2013.01); *H05K 1/0281* (2013.01); *H05K 3/0035* (2013.01); *H05K 3/421* (2013.01);
(Continued)

(58) Field of Classification Search
CPC .... H05K 1/115; H05K 1/0281; H05K 3/0035; H05K 3/421; H05K 3/429; H05K 3/4688;
(Continued)

(56) References Cited

U.S. PATENT DOCUMENTS

| 11,310,917 B2 * | 4/2022 | Higashira ............ H05K 1/0393 |
| 2017/0118837 A1 * | 4/2017 | Miura .................... H05K 1/034 |

(Continued)

FOREIGN PATENT DOCUMENTS

| CN | 102806723 A | * 12/2012 |
| WO | 2017/069217 A1 | 4/2017 |
| WO | 2019/188611 A1 | 10/2019 |

OTHER PUBLICATIONS

English translation (machine) of the Chinese Publication: CN102806723.*

*Primary Examiner* — Ishwarbhai B Patel
(74) *Attorney, Agent, or Firm* — Studebaker & Brackett PC

(57) ABSTRACT

Provided is a method for forming a through-hole including: forming a laminated body including a fluororesin layer having a first main surface and a second main surface, a first adhesive layer, a first reinforcing resin layer and a first conductor layer provided on the first main surface, a second adhesive layer, a second reinforcing resin layer and a second conductor layer provided on the second main surface; forming an opening in the first conductor layer and irradiating the opening with a laser beam to form a bottomed conduction hole with the second conductor layer exposed on a bottom surface of the conduction hole, wherein a thermal decomposition temperature of the second cured adhesive layer is lower than those of the first reinforcing resin layer and the second reinforcing resin layer, and a thickness of the second cured adhesive layer is 10 μm or more and 200 μm or less.

16 Claims, 11 Drawing Sheets

(51) Int. Cl.
*H05K 3/42* (2006.01)
*H05K 3/46* (2006.01)
*H05K 3/00* (2006.01)
*H05K 1/03* (2006.01)

(52) U.S. Cl.
CPC .......... *H05K 3/429* (2013.01); *H05K 3/4688* (2013.01); *H05K 1/036* (2013.01); *H05K 1/0313* (2013.01); *H05K 2201/015* (2013.01); *H05K 2201/0191* (2013.01); *H05K 2201/068* (2013.01); *H05K 2203/072* (2013.01)

(58) Field of Classification Search
CPC ............. H05K 1/036; H05K 2201/015; H05K 2201/0191; H05K 2201/068; H05K 2203/072; H05K 2203/061; H05K 2203/1572
See application file for complete search history.

(56) References Cited

U.S. PATENT DOCUMENTS

| | | | |
|---|---|---|---|
| 2018/0213637 A1 | 7/2018 | Hosoda et al. | |
| 2018/0339493 A1* | 11/2018 | Chen | B32B 15/20 |
| 2019/0141833 A1* | 5/2019 | Hosoda | H05K 1/11 |
| 2021/0170732 A1 | 6/2021 | Matsuyama et al. | |

* cited by examiner

⇧ IRRADIATION DIRECTION OF LASER BEAM

METHOD FOR FORMING THROUGH-HOLE, AND SUBSTRATE FOR FLEXIBLE PRINTED WIRING BOARD

CROSS-REFERENCE TO RELATED APPLICATION

This application claims priority from Japanese Patent Application No. 2020-171937 filed with the Japan Patent Office on Oct. 12, 2020, the entire content of which is hereby incorporated by reference.

BACKGROUND

1. Technical Field

The present disclosure relates to a method for forming a through-hole, and a substrate for flexible printed wiring board. More specifically, the present disclosure relates to the method for forming the through-hole in the substrate for flexible printed wiring board including a fluororesin layer in an inner layer of the substrate, and to the substrate for flexible printed wiring board.

2. Related Art

In recent years, along with development of 5th generation mobile communication system (5G) and the like, a printed wiring board having a small transmission loss in a high frequency region has been desired. In order to reduce the transmission loss of the printed wiring board, it is desired to reduce relative permittivity and dielectric loss tangent (tan S) of an insulating base material.

In a flexible printed wiring board (FPC), a film made of polyimide (PI) or a liquid crystal polymer (LCP) has been mainly used as the insulating base material. However, since these materials have relatively large relative permittivity and dielectric loss tangent in the high frequency region, it is difficult to sufficiently reduce the transmission loss for high frequency signals. Therefore, it is studied to apply a fluororesin having small relative permittivity and small dielectric loss tangent to an insulating layer of the flexible printed wiring board.

WO 2017/069217 describes a method for manufacturing a wiring substrate including: an electrical insulator layer including a fluororesin layer; a first conductor layer provided on a first surface of the electrical insulator layer; and a second conductor layer provided on a second surface of the electrical insulator layer, the wiring substrate having a hole leading from the first conductor layer to the second conductor layer and having a plating layer formed on an inner wall surface of the hole.

WO 2019/188611 describes a multilayer film in which a fluororesin layer and a polyimide layer are alternately laminated.

SUMMARY

A method for forming a through-hole according to the present disclosure, including: forming a laminated body including a fluororesin layer having a first main surface and a second main surface, a first adhesive layer provided on the first main surface, a first reinforcing resin layer provided on the first adhesive layer and having a linear expansion coefficient smaller than that of the fluororesin layer, a first conductor layer provided directly or indirectly on the first reinforcing resin layer, a second adhesive layer provided on the second main surface, a second reinforcing resin layer provided on the second adhesive layer and having a linear expansion coefficient smaller than that of the fluororesin layer, and a second conductor layer provided directly or indirectly on the second reinforcing resin layer; heating the laminated body to cure the first adhesive layer and the second adhesive layer, to be respectively a first cured adhesive layer and a second cured adhesive layer; forming an opening in the first conductor layer and irradiating the opening with a laser beam to remove the first reinforcing resin layer, the first cured adhesive layer, the fluororesin layer, the second cured adhesive layer, and the second reinforcing resin layer, to form a bottomed conduction hole with the second conductor layer exposed on a bottom surface of the conduction hole; and forming a plating layer on an inner wall of the conduction hole to electrically connect the first conductor layer and the second conductor layer, wherein a thermal decomposition temperature of the second cured adhesive layer is lower than those of the first reinforcing resin layer and the second reinforcing resin layer, and a thickness of the second cured adhesive layer is 10 μm or more and 200 μm or less.

DETAILED DESCRIPTION

Figure 1:
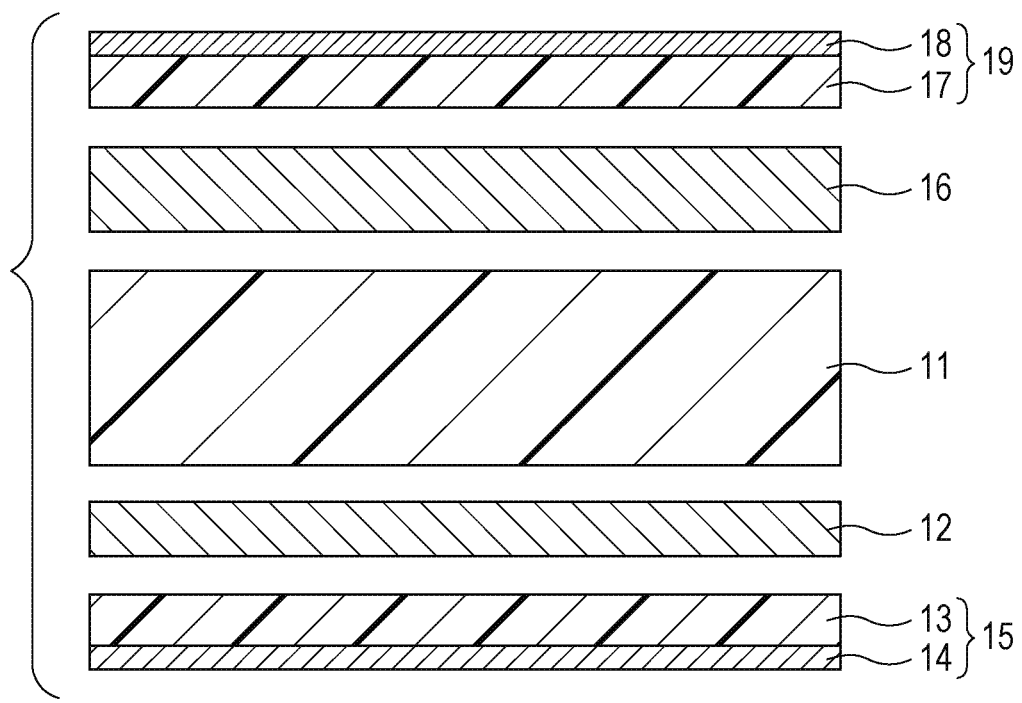
FIG. 1 is a cross-sectional view for explaining a step of forming a substrate for flexible printed wiring board according to a first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Generally, a fluororesin layer has high heat resistance, and high transmittance for a laser beam such as a carbon dioxide laser and a UV laser. Therefore, when a substrate including the fluororesin layer is irradiated with the laser beam to perforate a hole for forming a through-hole (conduction hole), it is required to irradiate the laser beam (or a large number of laser beam pulses) for a long time. As a result of long-term exposure of an insulating layer such as a polyimide layer adjacent to the fluororesin layer to the laser beam, a deep recess is formed in the fluororesin layer of the insulating layer. When such a recess is formed, in a plating step of forming a plating layer on an inner wall of the conduction hole, a void is generated because the recess formed in the inner wall of the conduction hole cannot be filled with a plating metal. The void expands in a subsequent heat treatment step, which causes deformation of the substrate. As the recess is deeper, the void is more likely to be generated, and thus it is desired to suppress generation of a deep void.

Figure 16:
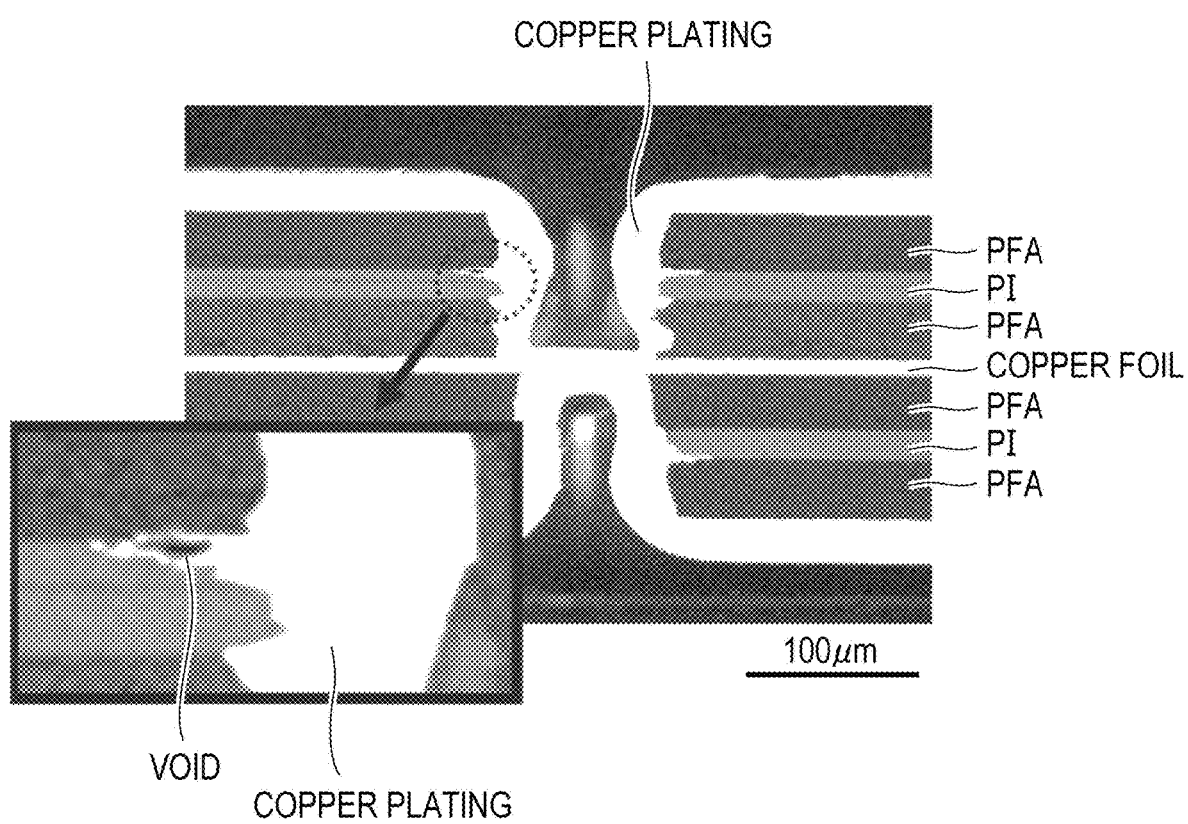
FIG. 16 is a cross-sectional photograph of the through-hole formed in a known substrate for flexible printed wiring board having a fluororesin layer in an inner layer of the substrate.

According to continuous research by the present inventors, it has been found that the above-mentioned recess is deeply formed in the insulating layer located below the fluororesin layer along a direction of irradiation with the laser beam. FIG. 16 is a cross-sectional photograph of the through-hole formed in a known substrate having a fluororesin layer (PFA), specifically, in a substrate in which base materials having a three-layer structure including PFA/PI/PFA are vertically laminated via a copper foil interposed therebetween. By irradiating the above substrate with the laser beam of the carbon dioxide laser from a vertical direction, the conduction hole (100 µm diameter) was formed. Thereafter, desmear processing and electroless copper plating were performed to form the through-hole. As a result, as illustrated in the cross-sectional photograph of FIG. 16, the deep recess was formed in the polyimide layer (PI) near an interface between the fluororesin layer (PFA) and the polyimide layer (PI), and a part (void) was generated that could not be filled with copper plating. Since the fluororesin layer has a high transmittance for the laser beam, the polyimide layer is exposed to the laser beam for a long time until the fluororesin layer is penetrated. In addition, the polyimide layer has a high heat resistance (high thermal decomposition temperature). Therefore, it is considered that as the polyimide was melted and decomposed near the interface between the fluororesin layer and the polyimide layer, the deep recess was formed in the polyimide layer near the interface.

The present disclosure has been made on the basis of the above-mentioned technical recognition unique to the present inventors, and an object of the present disclosure is to provide a method for forming a through-hole, that can suppress the generation of the void when forming the through-hole in a substrate for flexible printed wiring board including the fluororesin layer in an inner layer of the substrate, and to provide the substrate for flexible printed wiring board.

In the case of the substrate having the three-layer structure including PFA/PI/PFA as illustrated in FIG. 16, the polyimide layer (PI) having a high thermal decomposition temperature is directly bonded to the fluororesin layer (PFA) without using an adhesive layer having a relatively low thermal decomposition temperature. Therefore, according to consideration of the present inventors, it is considered that the polyimide layer (PI) was locally melted and decomposed until the fluororesin layer (PFA) was penetrated by irradiation with the laser beam, and as a result, the deep recess was formed in the polyimide layer.

As a result of diligent research by the present inventors, it has been found that by interposing an adhesive layer having a thermal decomposition temperature lower than that of a reinforcing resin layer and a thickness of 10 µm or more between the fluororesin layer and the reinforcing resin layer such as the polyimide layer, a gentle arcuate and relatively shallow recess is formed over almost entire thickness direction of the adhesive layer during laser processing. Thus, it has been found that since the recess can be filled with the plating metal, the generation of the void can be suppressed. The present disclosure is based on the above findings of the present inventors.

A method for forming a through-hole according to one aspect of the present disclosure, including: forming a laminated body including a fluororesin layer having a first main surface and a second main surface, a first adhesive layer provided on the first main surface, a first reinforcing resin layer provided on the first adhesive layer and having a linear expansion coefficient smaller than that of the fluororesin layer, a first conductor layer provided directly or indirectly on the first reinforcing resin layer, a second adhesive layer provided on the second main surface, a second reinforcing resin layer provided on the second adhesive layer and having a linear expansion coefficient smaller than that of the fluororesin layer, and a second conductor layer provided directly or indirectly on the second reinforcing resin layer; heating the laminated body to cure the first adhesive layer and the second adhesive layer, to be respectively a first cured adhesive layer and a second cured adhesive layer; forming an opening in the first conductor layer and irradiating the opening with a laser beam to remove the first reinforcing resin layer, the first cured adhesive layer, the fluororesin layer, the second cured adhesive layer, and the second reinforcing resin layer, to form a bottomed conduction hole with the second conductor layer exposed on a bottom surface of the conduction hole; and forming a plating layer on an inner wall of the conduction hole to electrically connect the first conductor layer and the second conductor layer, wherein a thermal decomposition temperature of the second cured adhesive layer is lower than those of the first reinforcing resin layer and the second reinforcing resin layer, and a thickness of the second cured adhesive layer is 10 µm or more and 200 µm or less.

In the method for forming the through-hole, the thickness of the second cured adhesive layer may be 20 μm or more and 100 μm or less.

Furthermore, the method for forming the through-hole may further includes: patterning the second conductor layer to form a conductive pattern; forming a second laminated body including a second fluororesin layer having a third main surface and a fourth main surface, a third adhesive layer provided on the third main surface, a third reinforcing resin layer provided on the third adhesive layer and having a linear expansion coefficient smaller than that of the second fluororesin layer, and a third conductor layer provided directly or indirectly on the third reinforcing resin layer; heating the second laminated body to cure the third adhesive layer, to be a third cured adhesive layer; forming a third laminated body by laminating the laminated body and the second laminated body via a fourth adhesive layer so that the conductive pattern of the heated laminated body and the second fluororesin layer of the heated second laminated body face each other; heating the third laminated body to cure the fourth adhesive layer, to be a fourth cured adhesive layer; forming an opening in the third conductor layer; irradiating the opening of the third conductor layer with the laser beam to remove the third reinforcing resin layer, the third cured adhesive layer, the second fluororesin layer, and the fourth cured adhesive layer, to form a bottomed second conduction hole with the conductive pattern exposed on a bottom surface of the second conduction hole; and forming a plating layer on an inner wall of the second conduction hole to electrically connect the third conductor layer and the conductive pattern, wherein the thermal decomposition temperature of the fourth cured adhesive layer may be lower than those of the first reinforcing resin layer, the second reinforcing resin layer, and the third reinforcing resin layer, and the thickness of the fourth cured adhesive layer excluding the thickness of the conductive pattern may be 10 μm or more and 200 μm or less.

A substrate for flexible printed wiring board according to one aspect of the present disclosure includes: a fluororesin layer having a first main surface and a second main surface opposite to the first main surface; a first cured adhesive layer provided on the first main surface of the fluororesin layer; a first reinforcing resin layer provided on the first cured adhesive layer and having a linear expansion coefficient smaller than that of the fluororesin layer; a first conductor layer provided directly or indirectly on the first reinforcing resin layer; a second cured adhesive layer provided on the second main surface of the fluororesin layer; a second reinforcing resin layer provided on the second cured adhesive layer and having a linear expansion coefficient smaller than that of the fluororesin layer; a second conductor layer provided directly or indirectly on the second reinforcing resin layer; and a through-hole that is formed by the method for forming the through-hole according to claim 1 and electrically connects the first conductor layer and the second conductor layer.

Furthermore, in the substrate for flexible printed wiring board, the first conductor layer may be provided directly on the first reinforcing resin layer without using an adhesive layer.

Furthermore, in the substrate for flexible printed wiring board, the second conductor layer may be provided directly on the second reinforcing resin layer without using an adhesive layer.

Furthermore, in the substrate for flexible printed wiring board, a thickness of the second cured adhesive layer may be 20 μm or more and 100 μm or less.

Furthermore, in the substrate for flexible printed wiring board, the first reinforcing resin layer and the second reinforcing resin layer may have a linear expansion coefficient of 30 ppm/° C. or less and an elastic modulus of 3 GPa or more.

A substrate for flexible printed wiring board according to one aspect of the present disclosure includes: a first fluororesin layer having a first main surface and a second main surface opposite to the first main surface; a first cured adhesive layer provided on the first main surface of the first fluororesin layer; a first reinforcing resin layer provided on the first cured adhesive layer and having a linear expansion coefficient smaller than that of the first fluororesin layer; a first conductor layer provided directly or indirectly on the first reinforcing resin layer; a second cured adhesive layer provided on the second main surface of the first fluororesin layer; a second reinforcing resin layer provided on the second cured adhesive layer and having a linear expansion coefficient smaller than that of the first fluororesin layer; a conductive pattern provided directly or indirectly on the second reinforcing resin layer; a second fluororesin layer having a third main surface facing the conductive pattern and a fourth main surface opposite to the third main surface; a third cured adhesive layer embedding the conductive pattern, and adhering the second reinforcing resin layer and the second fluororesin layer; a fourth cured adhesive layer provided on the fourth main surface of the second fluororesin layer; a third reinforcing resin layer provided on the fourth cured adhesive layer and having a linear expansion coefficient smaller than that of the second fluororesin layer; and a second conductor layer provided directly or indirectly on the third reinforcing resin layer, wherein thermal decomposition temperatures of the second cured adhesive layer and the third cured adhesive layer are lower than those of the first reinforcing resin layer, the second reinforcing resin layer, and the third reinforcing resin layer, a thickness of the second cured adhesive layer is 10 μm or more and 200 μm or less, and a thickness of the third cured adhesive layer excluding a thickness of the conductive pattern is 10 μm or more and 200 μm or less.

Furthermore, in the substrate for flexible printed wiring board, the first conductor layer may be provided directly on the first reinforcing resin layer without using an adhesive layer.

Furthermore, in the substrate for flexible printed wiring board, the second conductor layer may be provided directly on the third reinforcing resin layer without using an adhesive layer.

Furthermore, in the substrate for flexible printed wiring board, the conductive pattern may be provided directly on the second reinforcing resin layer without using an adhesive layer.

Furthermore, in the substrate for flexible printed wiring board, the thickness of the second cured adhesive layer, and the thickness of the third cured adhesive layer excluding the thickness of the conductive pattern may be 20 μm or more and 100 μm or less.

Furthermore, in the substrate for flexible printed wiring board, the first reinforcing resin layer, the second reinforcing resin layer, and the third reinforcing resin layer may have a linear expansion coefficient of 30 ppm/° C. or less and an elastic modulus of 3 GPa or more.

According to the present disclosure, it is possible to provide the method for forming the through-hole, that can suppress the generation of the void when forming the through-hole in the substrate for flexible printed wiring board including the fluororesin layer in the inner layer of the substrate, and to provide the substrate for flexible printed wiring board.

Hereinafter, a first embodiment according to the present disclosure will be described with reference to the drawings. Note that in the drawings, components having the same functions are denoted by the same reference numerals. In addition, since the drawings are schematic and mainly illustrate characteristic portions according to the embodiment, a relationship between a thickness and a plane dimension, a ratio of thicknesses of layers, and the like may be different from actual numerical values.

<Substrate for Flexible Printed Wiring Board FPCB1>

A substrate for flexible printed wiring board FPCB1 according to the first embodiment will be described with reference to FIG. 3. In the substrate for flexible printed wiring board FPCB1, a core insulating base material includes a fluororesin layer. The substrate for flexible printed wiring board FPCB1 is applied to, for example, the flexible printed wiring board for high-frequency signal transmission, having a microstrip line.

Figure 3:
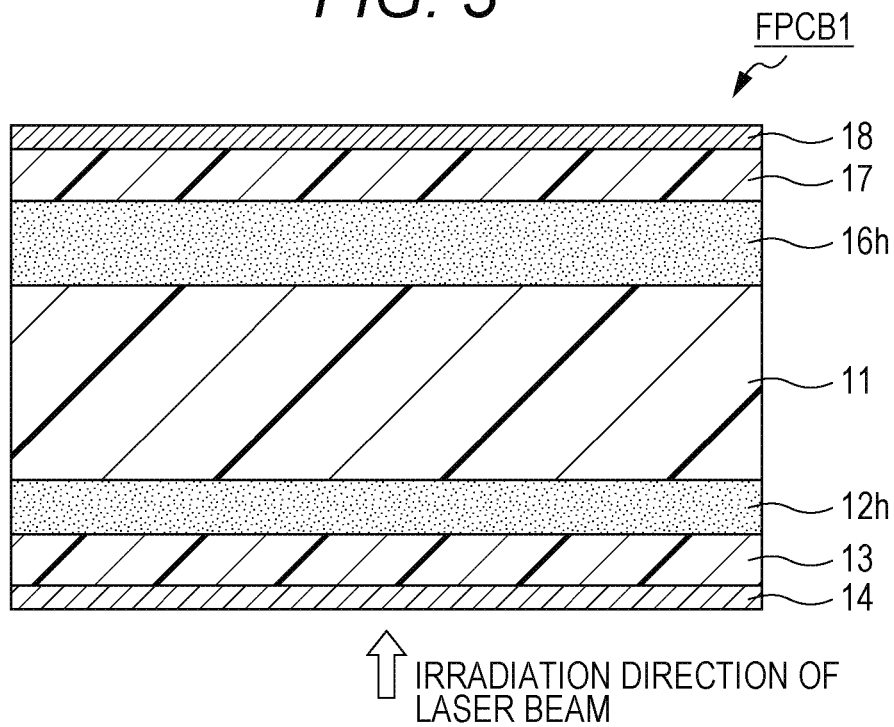
FIG. 3 is a cross-sectional view of the substrate for flexible printed wiring board according to the first embodiment.

As illustrated in FIG. 3, the substrate for flexible printed wiring board FPCB1 includes a fluororesin layer 11, a cured adhesive layer 12h provided on a lower surface of the fluororesin layer 11, a reinforcing resin layer 13 provided on the cured adhesive layer 12h, a conductor layer 14 directly or indirectly provided on the reinforcing resin layer 13, a cured adhesive layer 16h provided on an upper surface of the fluororesin layer 11, a reinforcing resin layer 17 provided on the cured adhesive layer 16h, and a conductor layer 18 provided directly or indirectly on the reinforcing resin layer 17.

Note that the adhesive layer may or may not be interposed between the reinforcing resin layer 13 and the conductor layer 14. In the present embodiment, the conductor layer 14 is directly bonded to the reinforcing resin layer 13. Similarly, with respect to the reinforcing resin layer 17 and the conductor layer 18, the adhesive layer may or may not be interposed between the reinforcing resin layer 17 and the conductor layer 18. In the present embodiment, the conductor layer 18 is directly bonded to the reinforcing resin layer 17.

As illustrated in FIG. 3, when perforating the conduction hole for forming the through-hole for electrically connecting the conductor layer 14 and the conductor layer 18, the laser beam is irradiated toward the conductor layer 14. In FIG. 3, an irradiation direction of the laser beam is from bottom to top.

The cured adhesive layer 16h is located on an inner side of the fluororesin layer 11 (upper surface side of the fluororesin layer 11 in FIG. 3) when viewed from the irradiation direction of the laser beam. The thermal decomposition temperature of the cured adhesive layer 16h is lower than the thermal decomposition temperature of the reinforcing resin layers 13 and 17. Further, the thickness of the cured adhesive layer 16h is 10 μm or more. Thus, when the conduction holes (conduction holes H1 and H2 described below) are perforated by the laser beam, it is possible to suppress the generation of the deep recess in the cured adhesive layer 16h. As a result, the plating metal can be filled in the recess during the plating step, so that the generation of the void can be suppressed.

Next, the components of the substrate for flexible printed wiring board FPCB1 will be described in detail.

The fluororesin layer 11 has the first main surface facing the cured adhesive layer 12h and the second main surface opposite to the first main surface. The fluororesin layer 11 is an insulating film including a fluororesin. The fluororesin is, for example, tetrafluoroethylene-perfluoroalkyl vinyl ether copolymer (PFA), tetrafluoroethylene-hexafluoropropylene copolymer (FEP), polytetrafluoroethylene (PTFE), ethylene-tetrafluoroethylene copolymer (ETFE), polyvinylidene fluoride (PVdF), or the like.

The thickness of the fluororesin layer 11 is, for example, 12.5 to 200 μm, and preferably 25 to 100 μm. When the thickness of the fluororesin layer 11 is thinner than a lower limit value of 12.5 μm, dielectric properties of the substrate for flexible printed wiring board FPCB1 are deteriorated. On the other hand, when the thickness of the fluororesin layer 11 is thicker than an upper limit value of 200 μm, it is difficult to ensure handleability and dimensional stability of the substrate for flexible printed wiring board FPCB1.

Note that the fluororesin layer 11 is not limited to a one-layer film. The fluororesin layer 11 may have a multilayer structure in which a plurality of films is laminated. For example, the fluororesin layer 11 may have a two-layer structure in which PFA and PTFE are laminated. Further, for example, when adhesiveness between PTFE and an adhesive is not sufficient, a three-layer structure (PFA/PTFE/PFA) in which PTFE is sandwiched between PFAs may be used.

Further, the fluororesin layer 11 may contain an inorganic filler having low dielectric constant and low dielectric loss tangent. Examples of the inorganic filler include silica, clay, talc, calcium carbonate, mica, diatomaceous earth, alumina, zinc oxide, titanium oxide, calcium oxide, magnesium oxide, boron nitride, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, active white clay, sepiolite, imogolite, sericite, glass fiber, glass bead, silica-based balloon, carbon black, carbon nanotube, carbon nanohorn, graphite, carbon fiber, glass fiber, silicon fiber, LCP fiber, glass balloon, carbon balloon, wood flour, zinc borate and the like. The fluororesin layer 11 may include one kind of inorganic filler, or may include two or more kinds of inorganic fillers.

The content of the inorganic filler is preferably 0.1 to 100 mass %, and more preferably 0.1 to 60 mass %, based on the fluororesin layer 11 which is a fluorine-containing copolymer. When the inorganic filler is porous, the dielectric constant and the dielectric loss tangent of the fluororesin layer 11 can be further reduced. Further, dispersibility of the inorganic filler in the fluorine-containing copolymer may be improved by surface-treating the inorganic filler with a surface treatment agent such as a silane coupling agent or a titanate coupling agent.

Further, in order to reduce the linear expansion coefficient of the fluororesin, the fluororesin layer 11 may include aramid fiber woven fabric, aramid fiber non-woven fabric, aramid paper, aramid film, glass fiber woven fabric, cotton woven fabric, paper, or the like.

Further, as the fluororesin layer 11, a surface-modified fluororesin layer, a fluororesin layer in which an adhesive component is copolymerized, or the like may be used.

Next, the cured adhesive layers 12h and 16h will be described.

The cured adhesive layers 12h and 16h are insulating layers that are cured by heating thermosetting adhesive layers 12 and 16 (described below).

The thickness of the cured adhesive layers 12h and 16h is preferably 10 μm or more and 200 μm or less, and more preferably 20 μm or more and 100 μm or less. Specifically, the cured adhesive layer 16h preferably has a thickness of 10 μm or more, and more preferably 20 μm or more. When the cured adhesive layer 16h is thinner than 10 μm, and the conduction hole is perforated by the laser beam, the recess formed in the cured adhesive layer 16h is deep, and the void is likely to be generated in the plating step. As the cured adhesive layer 16h is thicker, a depth (length) of the recess formed is smaller. Note that when the cured adhesive layers 12h and 16h are thicker than 200 μm, the dielectric properties and flexibility of the substrate for flexible printed wiring board FPCB1 are deteriorated. Therefore, the cured adhesive layers 12h and 16h preferably have a thickness of 200 μm or less.

Next, the reinforcing resin layers 13 and 17 will be described.

The linear expansion coefficients of the reinforcing resin layers 13 and 17 are smaller than linear expansion coefficients of the fluororesin layers 11. As the linear expansion coefficient is smaller, the dimensional stability of the substrate for flexible printed wiring board FPCB1 is less impaired, and the reinforcing resin layers 13 and 17 can be made thinner.

The linear expansion coefficients of the reinforcing resin layers 13 and 17 are preferably 30 ppm/° C. or less, and more preferably 25 ppm/° C. or less. Here, the numerical value of the linear expansion coefficient is a numerical value at normal temperature (similarly, the numerical values of the linear expansion coefficients below are numerical values at normal temperature). By using the reinforcing resin layers 13 and 17 having a linear expansion coefficient of 30 ppm/° C. or less, it is possible to suppress occurrence of warpage and deterioration of the dimensional stability of the substrate for flexible printed wiring board FPCB1.

The elastic moduli of the reinforcing resin layers 13 and 17 are preferably 3 GPa or more, and more preferably 6 GPa or more. Here, the numerical value of the elastic modulus is a numerical value at normal temperature (similarly, the numerical values of the elastic moduli below are numerical values at normal temperature). Thus, for example, during cooling after an integration step (described below) or during patterning of the conductor layer 18, it is possible to reduce shrinkage of the substrate for flexible printed wiring board FPCB1, thereby improving the dimensional stability of the substrate for flexible printed wiring board FPCB1.

The reinforcing resin layers 13 and 17 are made of, for example, polyimide (PI) such as aromatic polyimide, or liquid crystal polymer (LCP), polyetheretherketone (PEEK), or the like. Since the linear expansion coefficient of polyimide coefficient is lower than the linear expansion coefficient of LCP and PEEK, it is easy to ensure the dimensional stability. Since water absorption rates of LCP and PEEK are smaller than the water absorption rate of polyimide, it is possible to suppress increase in the dielectric constant and the dielectric loss tangent and deterioration of transmission characteristics, due to moisture absorption. Note that as an LCP film, Vecstar (registered trademark) of Kuraray Co., Ltd. may be used.

In addition to the above materials, as materials for the reinforcing resin layers 13 and 17, polyarylate, polysulfone, polyallyl sulfone (polyether sulfone or the like), aromatic polyamide, aromatic polyether amide, polyphenylene sulfide, polyallyl ether ketone, polyamideimide, liquid crystal polyester, or the like may be used.

The thickness of the reinforcing resin layers 13 and 17 is, for example, 7.5 to 200 μm, and preferably 12.5 to 100 μm. When the thickness of the reinforcing resin layers 13 and 17 is thinner than the lower limit value of 7.5 μm, it is difficult to ensure the handleability and the dimensional stability. On the other hand, when the thickness of the reinforcing resin layers 13 and 17 is thicker than the upper limit value of 200 μm, the dielectric properties and the flexibility of the substrate for flexible printed wiring board FPCB1 are deteriorated.

The reinforcing resin layers 13 and 17 are not limited to the one-layer film. The reinforcing resin layers 13 and 17 may have the multilayer structure in which a plurality of films is laminated. For example, the reinforcing resin layers 13 and 17 may be formed by bonding a thermoplastic resin and a non-thermoplastic resin. Thus, the reinforcing resin layers 13 and 17 with high flexibility can be obtained.

Next, the conductor layers 14 and 18 will be described.

The conductor layers 14 and 18 are metal foils such as copper or copper alloy, stainless steel, nickel or nickel alloy (including 42 alloy), or aluminum or aluminum alloy. In the present embodiment, the conductor layers 14 and 18 are copper foils such as rolled copper foil or electrolytic copper foil.

Surfaces facing the reinforcing resin layers 13 and 17 out of main surfaces of the conductor layers 14 and 18 may be subjected to chemical or mechanical surface treatment in order to improve the adhesiveness. Examples of the chemical surface treatment include plating treatment such as nickel plating and copper-zinc alloy plating, and treatment with a surface treatment agent such as aluminum alcoholate, aluminum chelate, or a silane coupling agent. Among the chemical surface treatments, the surface treatment with the silane coupling agent is preferred. As the silane coupling agent, a silane coupling agent having an amino group can be preferably used. On the other hand, examples of the mechanical surface treatment include roughening treatment and the like.

The thickness of the conductor layers 14 and 18 is not particularly limited as long as they can exhibit sufficient functions according to application of the flexible printed wiring board. Considering the flexibility and the like of the flexible printed wiring board, the thickness of the conductor layers 14 and 18 is preferably 6 to 70 μm, and more preferably 9 to 35 μm.

Ten-point average roughness (Rz) of the conductor layer, in which at least a signal line is formed, out of the conductor layers 14 and 18 is preferably 2.0 μm or less, and more preferably 1.3 μm or less. Thus, even when current of high-frequency signal flows only in a surface layer portion of the conductor layer due to skin effect, an increase in a propagation distance of the signal is suppressed. As a result, when transmitting the high frequency signal, a transmission speed can be maintained and an increase in transmission loss can be suppressed.

As illustrated in FIG. 3, in the present embodiment, the conductor layer 14 is directly provided on the reinforcing resin layer 13 without using the adhesive layer. Similarly, the conductor layer 18 is directly provided on the reinforcing resin layer 17 without using the adhesive layer. Since there is no adhesive between the layers, the thickness of the substrate for flexible printed wiring board FPCB1 can be reduced, and sufficient flexibility can be ensured. Alternatively, when the thickness of the substrate for flexible printed wiring board FPCB1 is constant, the cured adhesive layers 12h and 16h or the reinforcing resin layers 13 and 17 can be thickened without using an adhesive. As a result, it is possible to improve the dimensional stability of the substrate for flexible printed wiring board FPCB1 and laser workability when perforating the conduction hole by the laser beam.

In the substrate for flexible printed wiring board FPCB1 described above, the thermal decomposition temperature of the cured adhesive layer 16h on the inner side of the fluororesin layer 11 when viewed from the irradiation direction of the laser beam is made lower than the thermal decomposition temperature of the reinforcing resin layers 13 and 17, and the thickness of the cured adhesive layer 16h is set to 10 µm or more and 200 µm or less. Thus, it is possible to suppress formation of the deep recess in the cured adhesive layer 16h when the conduction hole is perforated by the laser beam. As a result, the plating metal can be filled in the recess when through-hole plating is performed, so that the generation of the void can be suppressed.

<Method for Manufacturing Substrate for Flexible Printed Wiring Board FPCB1>

A method for manufacturing the substrate for flexible printed wiring board FPCB1 described above will be described with reference to FIGS. 1 to 3.

First, the fluororesin layer 11, the adhesive layers 12 and 16, and single-sided metal foil-clad laminates 15 and 19 are prepared.

The fluororesin layer 11 is not limited to the one-layer film. The fluororesin layer 11 may have the multilayer structure in which a plurality of films is laminated. For example, the fluororesin layer 11 may use the three-layer structure including PFA/PTFE/PFA. Thus, the fluororesin layer 11 and the adhesive layers 12 and 16 can be firmly adhered to each other.

The adhesive layers 12 and 16 are preferably made of an adhesive having excellent heat resistance. Examples of such an adhesive include various resin-based heat-curable adhesives having excellent dielectric properties, such as a modified polyolefin resin-based adhesive, an epoxy resin-based adhesive, a butyral resin-based adhesive, a bismaleimide-based adhesive, a polyimide-based adhesive, a modified polyphenylene ether-based adhesive, or a modified aromatic polyester-based adhesive. As commercially available adhesives, for example, adhesive sheet SAFY of Nikkan Industries Co., Ltd., Aron Mighty AS-700 of Toagosei Co., Ltd., adhesive added with PIAD (thermoplastic polyimide varnish) of Arakawa Chemical Industries. Ltd., epoxy, and active ester resin, ESPANEX NSC-003 of NIPPON STEEL Chemical & Material Co., Ltd., or the like can be used.

The thickness of the adhesive layers 12 and 16 is preferably 10 µm or more and 200 µm or less, and more preferably 20 µm or more and 100 µm or less. Specifically, the adhesive layer 16 preferably has a thickness of 10 µm or more, and more preferably has a thickness of 20 µm or more.

The single-sided metal foil-clad laminate 15 has a structure in which the conductor layer 14 is provided as the metal foil on one side of the reinforcing resin layer 13 that is the insulating layer. The single-sided metal foil-clad laminate 19 has a structure in which the conductor layer 18 is provided as the metal foil on one side of the reinforcing resin layer 17 that is the insulating layer. As the single-sided metal foil-clad laminates 15 and 19, commercially available flexible cupper-clad laminate (FCCL) such as non-adhesive copper-clad laminate ESPANEX (registered trademark) of NIPPON STEEL Functional Material Manufacturing Co., Ltd. may be used.

Figure 2:
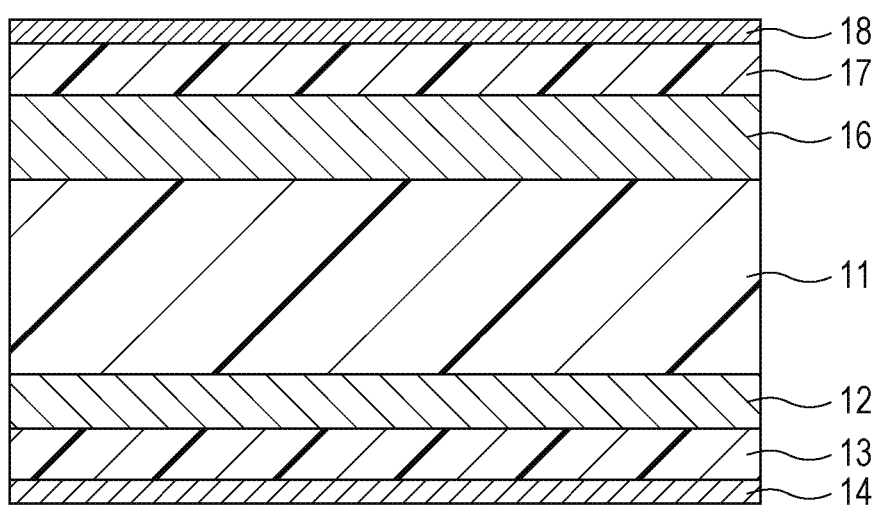
FIG. 2 is a cross-sectional view for explaining a step of forming the substrate for flexible printed wiring board according to the first embodiment, following FIG. 1.

Next, as illustrated in FIGS. 1 and 2, the fluororesin layer 11 is disposed to be sandwiched between the single-sided metal foil-clad laminates 15 and 19 via the adhesive layers 12 and 16 that are adhesive sheets, and is pressed to form a laminated body LB1. Note that this step is preferably performed as so-called temporary lamination at a temperature (for example, 60 to 80° C.) lower than a glass transition temperature of each resin layer. The temporary lamination may be performed by a vacuum press or a roll-to-roll method. When the temporary lamination is performed by the roll-to-roll method, pressure heating is performed on a predetermined region of a sheet unwound from a metal roll, and after the pressure heating of the predetermined region of the sheet is completed, the metal roll is rotated and the pressure heating is performed on another region.

Note that when the adhesive sheet is not used as the adhesive layers 12 and 16, the laminated body LB1 may be formed by applying the adhesive to the lower surface of the fluororesin layer 11 to form the adhesive layer 12, and then bonding the single-sided metal foil-clad laminate 15, and similarly by applying the adhesive to the upper surface of the fluororesin layer 11 to form the adhesive layer 16, and then bonding the single-sided metal foil-clad laminate 19. Of course, the adhesive may be applied to the reinforcing resin layer 13 to form the adhesive layer 12, and then the single-sided metal foil-clad laminate 15 on which the adhesive layer 12 is formed may be laminated on the lower surface of the fluororesin layer 11. Similarly, the adhesive may be applied to the reinforcing resin layer 17 to form the adhesive layer 16, and then the single-sided metal foil-clad laminate 19 on which the adhesive layer 16 is formed may be laminated on the upper surface of the fluororesin layer 11.

After forming the laminated body LB1 as described above, the adhesive layer 12 and the adhesive layer 16 are cured by heating the laminated body LB1. Thus, the adhesive layer 12 and the adhesive layer 16 respectively become the cured adhesive layer 12h and the cured adhesive layer 16h (integration step). More specifically, in this step, the laminated body LB1 is integrated by pressurizing the laminated body LB1 while heating at a curing temperature or higher of the adhesive layers 12 and 16. Through this step, the substrate for flexible printed wiring board FPCB1 illustrated in FIG. 3 is obtained.

Note that heating temperature of the adhesive layers 12 and 16 is, for example, 250° C. or lower. Preferably, the heating temperature of the adhesive layers 12 and 16 is preferably 200° C. or lower, or is equal to or lower than a temperature obtained by adding 90° C. (preferably 60° C.) to a glass transition temperature of the fluororesin constituting the fluororesin layer 11. If the adhesive layers 12 and 16 are heated at a temperature higher than this, when they are cooled to room temperature, residual strain may increase and the dimensional stability may be deteriorated. As the heating temperature is lower, a curing rate of the adhesive is lower, and it takes longer to adhere. On the other hand, the dimensional stability is improved when the adhesive layers 12 and 16 are cured over a longer heating time.

When the reinforcing resin layers 13 and 17 contain a small amount of water, and are heated at a temperature exceeding 180° C., the reinforcing resin layers 13 and 17 may foam due to rapid volatilization of the water. As the heating temperature is lower, the volatilization is slower and foaming can be more suppressed.

Based on the above points, when the fluororesin layer 11 is PFA or PTFE and the reinforcing resin layers 13 and 17 are LCP, the foaming of the reinforcing resin layers 13, 17 can be suppressed by setting the heating temperature to a temperature in a range of 130 to 230° C. Therefore, the substrate for flexible printed wiring board with good dimensional stability can be obtained.

Through the above steps, the substrate for flexible printed wiring board FPCB1 illustrated in FIG. 3 is obtained.

Note that in the above manufacturing method, a surface-treated fluororesin layer may be used as the fluororesin layer 11. For example, a bonding surface (main surface) of the fluororesin layer 11 is surface-modified, and then is laminated with the single-sided metal foil-clad laminates 15 and 19 via the adhesive layers 12 and 16, so that it is possible to secure adhesive strength after the integration step. In this case, a commercially available fluororesin film that is subjected to surface modification treatment can be used as the fluororesin layer 11.

Here, the surface modification will be described. The surface modification is performed by forming an active site on the surface of the fluororesin layer, and contacting the formed active site with any one of highly hydrophilic functional group, monomer, oligomer, and polymer, or a mixture thereof (hereinafter, also simply referred to as a modifying material). By the surface modification, a so-called tack feeling and the adhesiveness can be obtained on the surface of the fluororesin layer. For example, as the surface-modified fluororesin layer 11, the fluororesin layer subjected to vacuum plasma processing is used. By applying the vacuum plasma processing, the surface of the fluororesin layer 11 is added with hydrophilic functional group (polar group) such as $NH_2$ group, COOH group, or OH group depending on the type of processing gas for the vacuum plasma processing.

Examples of a method for forming the active site on the surface of the fluororesin layer 11 include a method of irradiating the surface of the fluororesin layer 11 with active rays such as ultraviolet rays (UV) or excimer laser beam, and methods by discharge such as corona discharge or plasma discharge. As the method for forming the active site on the surface of the fluororesin layer 11, in addition to the above methods, for example, a method of immersing the fluororesin layer in an alkali metal complex solution may be used. As a method of contacting the fluororesin layer 11 with the modifying material, there is a method of directly contacting the fluororesin layer 11 with a gaseous or liquid modifying material. In addition to the above method, as the method of contacting the fluororesin layer 11 with the modifying material, for example, a method of contacting the fluororesin layer with a mixed gas in which the modifying material is diluted with a carrier gas, an aqueous solution in which the modifying material is dissolved, or an organic solvent solution in which the modifying material is dissolved may also be used.

Note that when irradiating the active rays in order to form the active site in the fluororesin layer 11, it is also effective to irradiate the fluororesin layer 11 with the active rays in a state where the gaseous or liquid modifying material is in direct contact with the fluororesin layer 11. Alternatively, when irradiating the active rays in order to form the active site in the fluororesin layer 11, it is also effective to irradiate the fluororesin layer 11 with the active rays in a state where the fluororesin layer 11 is in contact with the mixed gas in which the modifying material is diluted with the carrier gas, the aqueous solution in which the modifying material is dissolved, or the organic solvent solution in which the modifying material is dissolved.

The vacuum plasma processing is a promising method for the surface modification. The vacuum plasma processing is performed by exposing a treated base material (the fluororesin layer 11 in the present embodiment) to a glow discharge or the like in a vacuum that is started and maintained by applying a high voltage of direct current or alternating current between electrodes. In the case of the vacuum plasma processing, there are relatively many choices of processing gas (modifying material). For example, He, Ne, Ar, $N_2$, $O_2$, carbon dioxide gas, air, water vapor, ammonia gas and the like can be used as the processing gas. As the processing gas, a mixed gas of these gases may be used. Specifically, good results can be obtained by imparting an adhesive functional group to the surface of the fluororesin layer 11 by the vacuum plasma processing using $N_2$ gas, $N_2+H_2$ gas (mixed gas of nitrogen and hydrogen), $N_2+O_2$ gas (mixed gas of nitrogen and oxygen), ammonia gas or the like as the processing gas.

In the above manufacturing method, the single-sided metal foil-clad laminates 15 and 19 are used, but instead of the single-sided metal foil-clad laminate 15, the reinforcing resin layer 13 and the conductor layer 14 may be sequentially laminated, and instead of the single-sided metal foil-clad laminate 19, the reinforcing resin layer 17 and the conductor layer 18 may be sequentially laminated. In this case, in order to directly adhere the conductor layers 14 and 18 having a low linear expansion coefficient and the reinforcing resin layers 13 and 17 such as PI or LCP, for example, the reinforcing resin layers 13 and 17 are heated to near a melting point thereof, and then the conductor layers 14 and 18 are bonded to the reinforcing resin layers 13 and 17 and pressed. Thereafter, the reinforcing resin layers 13 and 17 are slowly cooled so as not to have distortion left. In addition to the vacuum press, the roll-to-roll method, a double belt press, a rotopress, or the like can be used for a lamination/integration process of the conductor layers 14 and 18 and the reinforcing resin layers 13 and 17.

<Substrate for Flexible Printed Wiring Board FPCB2>

Next, with reference to FIG. 10, a substrate for flexible printed wiring board FPCB2 according to a second embodiment will be described. In the substrate for flexible printed wiring board FPCB2, the core insulating base material includes the fluororesin layer. The substrate for flexible printed wiring board FPCB2 is applied to, for example, the flexible printed wiring board for high-frequency signal transmission having a strip line.

Figure 10:
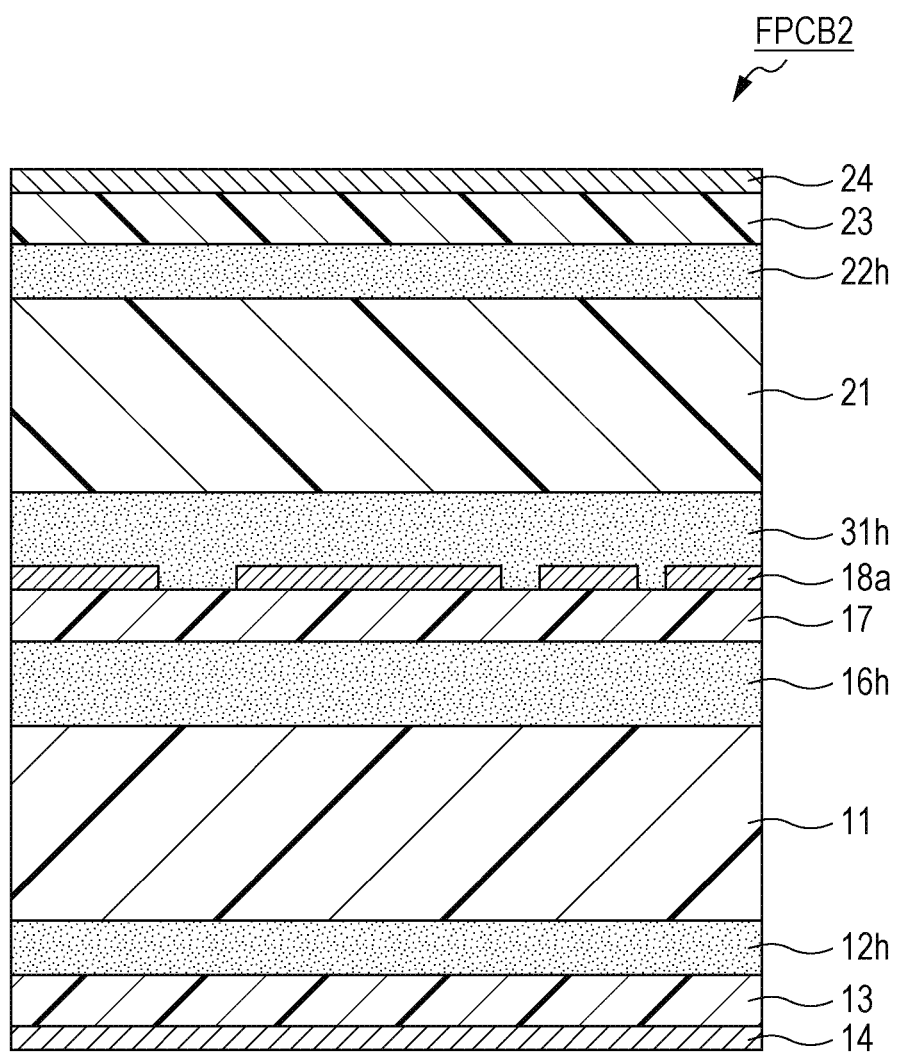
FIG. 10 is a cross-sectional view of the substrate for flexible printed wiring board according to the second embodiment.

As illustrated in FIG. 10, a lower portion of the substrate for flexible printed wiring board FPCB2 has the same configuration as the substrate for flexible printed wiring board FPCB1 described in the first embodiment. However, in the substrate for flexible printed wiring board FPCB2, a conductive pattern 18a is provided instead of the conductor layer 18 of the substrate for flexible printed wiring board FPCB1.

The conductive pattern 18a is directly or indirectly provided on the reinforcing resin layer 17. In the present embodiment, the conductive pattern 18a is directly bonded to the reinforcing resin layer 17 without using the adhesive layer.

As illustrated in FIG. 10, the substrate for flexible printed wiring board FPCB2 further includes a fluororesin layer 21, a cured adhesive layer 31h provided on a lower surface of the fluororesin layer 21 and embedding the conductive pattern 18a, a cured adhesive layer 22h provided on an upper surface of the fluororesin layer 21, a reinforcing resin layer 23 provided on the cured adhesive layer 22h, and a conductor layer 24 directly or indirectly provided on the reinforcing resin layer 23.

The thermal decomposition temperatures of the cured adhesive layer 16h and the cured adhesive layer 31h are lower than the thermal decomposition temperatures of the reinforcing resin layers 13, 17, and 23. Further, the thickness of the cured adhesive layer 16h is 10 μm or more and 200 μm or less. The thickness of the cured adhesive layer 31h excluding the thickness of the conductive pattern 18a (that is, a length from an upper surface of the conductive pattern 18a to the fluororesin layer 21) is 10 μm or more and 200 μm or less. Thus, when the conduction holes (conduction holes H1 and H2 described below) are perforated by the laser beam, it is possible to suppress the generation of the deep recess in the cured adhesive layer 16h. As a result, the plating metal can be filled in the recess when the through-hole plating is performed, so that the generation of the void can be suppressed.

Next, the components of the substrate for flexible printed wiring board FPCB2 will be described in detail. However, detailed description of the same configuration as that of the first embodiment will be omitted.

The fluororesin layer 21 has a third main surface facing the conductive pattern 18a and a fourth main surface opposite to the third main surface. The fluororesin layer 21 is the insulating film containing the fluororesin. A material of the fluororesin layer 21 is the same as that of the fluororesin layer 11 described above.

The thickness of the fluororesin layer 21 is, for example, 12.5 to 200 μm, and preferably 25 to 100 μm. When the thickness of the fluororesin layer 21 is thinner than the lower limit value of 12.5 μm, the dielectric properties of the substrate for flexible printed wiring board FPCB2 are deteriorated. On the other hand, when the thickness of the fluororesin layer 21 is thicker than the upper limit value of 200 μm, it is difficult to ensure the handleability and the dimensional stability of the substrate for flexible printed wiring board FPCB2.

Similar to the fluororesin layer 11, the fluororesin layer 21 may be a surface-modified fluororesin layer, a fluororesin layer in which adhesive components are copolymerized, or the like.

Note that the fluororesin layer 21 is not limited to the one-layer film. The fluororesin layer 21 may have the multilayer structure in which a plurality of films is laminated. The fluororesin layer 21 may have, for example, the two-layer structure in which PFA and PTFE are laminated. Further, for example, when the adhesiveness between PTFE and the adhesive is not sufficient, the three-layer structure (PFA/PTFE/PFA) in which PTFE is sandwiched between PFAs may be used.

Further, the fluororesin layer 21 may contain the inorganic filler having low dielectric constant and low dielectric loss tangent. The material and the content of the inorganic filler are the same as those of the fluororesin layer 11.

Next, the cured adhesive layers 22h and 31h will be described.

The cured adhesive layers 22h and 31h are insulating layers that are cured by heating the thermosetting adhesive layers 22 and 31 (described below).

The cured adhesive layer 31h is an insulating layer embedding the conductive pattern 18a and adhering the reinforcing resin layer 17 and the fluororesin layer 21 to each other.

The thickness of the cured adhesive layer 22h, and the thickness of the cured adhesive layer 31h excluding the thickness of the conductive pattern 18a are preferably 10 μm or more and 200 μm or less, and more preferably 20 μm or more and 100 μm or less. Specifically, the cured adhesive layer 31h preferably has a thickness of 10 μm or more, and more preferably 20 μm or more. When the cured adhesive layer 31h is thinner than 10 μm, and the conduction hole is perforated by the laser beam, the recess formed in the cured adhesive layer 31h is deep, and the void is likely to be generated in the plating step. As the cured adhesive layer 31h is thicker, the depth of the recess formed is smaller. Note that when the cured adhesive layers 22h and 31h are thicker than 200 μm, the dielectric properties and the flexibility of the substrate for flexible printed wiring board FPCB2 are deteriorated. Therefore, the cured adhesive layers 22h and 31h preferably have a thickness of 200 μm or less.

Next, the reinforcing resin layer 23 will be described.

The linear expansion coefficient of the reinforcing resin layer 23 is smaller than the linear expansion coefficient of the fluororesin layer 21. As the linear expansion coefficient is smaller, the dimensional stability of the substrate for flexible printed wiring board FPCB2 is less impaired, and the reinforcing resin layer 23 can be made thinner. The material of the reinforcing resin layer 23 is the same as those of the reinforcing resin layers 13 and 17 described above.

The thickness of the reinforcing resin layer 23 is, for example, 7.5 to 200 μm, and preferably 12.5 to 100 μm. When the thickness of the reinforcing resin layer 23 is thinner than the lower limit value of 7.5 μm, it is difficult to ensure the handleability and the dimensional stability. On the other hand, when the thickness of the reinforcing resin layer 23 is thicker than the upper limit value of 200 μm, the dielectric properties and the flexibility of the substrate for flexible printed wiring board FPCB2 are deteriorated.

The linear expansion coefficient of the reinforcing resin layer 23 is preferably 30 ppm/° C. or less, and more preferably 25 ppm/° C. or less. By using the reinforcing resin layer 23 having a linear expansion coefficient of 30 ppm/° C. or less, it is possible to suppress the occurrence of the warpage and the deterioration of the dimensional stability of the substrate for flexible printed wiring board FPCB2.

The elastic modulus of the reinforcing resin layer 23 is preferably 3 GPa or more, and more preferably 6 GPa or more. Thus, it is possible to reduce the shrinkage of the substrate for flexible printed wiring board FPCB2, for example, during cooling after the integration step, thereby improving the dimensional stability of the substrate for flexible printed wiring board FPCB2.

Note that the reinforcing resin layer 23 is not limited to the one-layer film. The reinforcing resin layer 23 may have the multilayer structure in which a plurality of films is laminated. For example, the reinforcing resin layer 23 may be formed by bonding the thermoplastic resin and the non-thermoplastic resin. Thus, the reinforcing resin layer with high flexibility can be obtained.

Next, the conductor layer 24 will be described. Since the conductor layer 14 is as described above, description thereof will be omitted. Since the conductive pattern 18a is the same as the conductor layer 18, description thereof will be omitted.

The conductor layer 24 is the metal foil such as copper or copper alloy, stainless steel, nickel or nickel alloy (including 42 alloy), or aluminum or aluminum alloy. In the present embodiment, the conductor layer 24 is the copper foil such as rolled copper foil or electrolytic copper foil.

A surface facing the reinforcing resin layer 23 out of main surfaces of the conductor layer 24 may be subjected to chemical or mechanical surface treatment in order to improve the adhesiveness.

The thickness of the conductor layer 24 is not particularly limited as long as it can exhibit sufficient functions according to the application of the flexible printed wiring board. Considering the flexibility and the like of the flexible printed wiring board, the thickness of the conductor layer 24 is preferably 6 to 70 μm, and more preferably 9 to 35 μm.

As illustrated in FIG. 10, in the present embodiment, the conductor layer 14 is directly provided on the reinforcing resin layer 13 without using the adhesive layer. Similarly, the conductive pattern 18a is directly provided on the reinforcing resin layer 17 without using the adhesive layer. The conductor layer 24 is directly provided on the reinforcing resin layer 23 without using the adhesive layer. By not using the adhesive in this way, the thickness of the substrate for flexible printed wiring board FPCB2 can be reduced, so that sufficient flexibility can be ensured. Alternatively, when the thickness of the substrate for flexible printed wiring board FPCB2 is constant, the cured adhesive layers 12h, 16h, 22h, and 31h and the reinforcing resin layers 13, 17, and 23 can be thickened, and as a result, it is possible to improve the dimensional stability of the substrate for flexible printed wiring board FPCB2 and the laser workability when perforating the conduction hole by the laser beam.

In the substrate for flexible printed wiring board FPCB2 described above, the thermal decomposition temperature of the cured adhesive layer 16h on the inner side of the fluororesin layer 11 when viewed from the irradiation direction of the laser beam is made lower than the thermal decomposition temperatures of the reinforcing resin layers 13, 17, and 23, and the thickness of the cured adhesive layer 16h is set to 10 μm or more and 200 μm or less. Further, the thermal decomposition temperature of the cured adhesive layer 31h on the inner side of the fluororesin layer 21 when viewed from the irradiation direction of the laser beam is made lower than the thermal decomposition temperatures of the reinforcing resin layers 13, 17, and 23, and the thickness of the cured adhesive layer 31h excluding the thickness of the conductive pattern 18a is set to 10 μm or more and 200 μm or less. Thus, it is possible to suppress the formation of the deep recess in the cured adhesive layers 16h and 31h when the conduction hole is perforated by the laser beam. As a result, the plating metal can be filled in the recess when the through-hole plating is performed, so that the generation of the void can be suppressed.

<Method for Manufacturing Substrate for Flexible Printed Wiring Board FPCB2>

A method for manufacturing the substrate for flexible printed wiring board FPCB2 described above will be described with reference to FIGS. 4 to 10.

Figure 4:
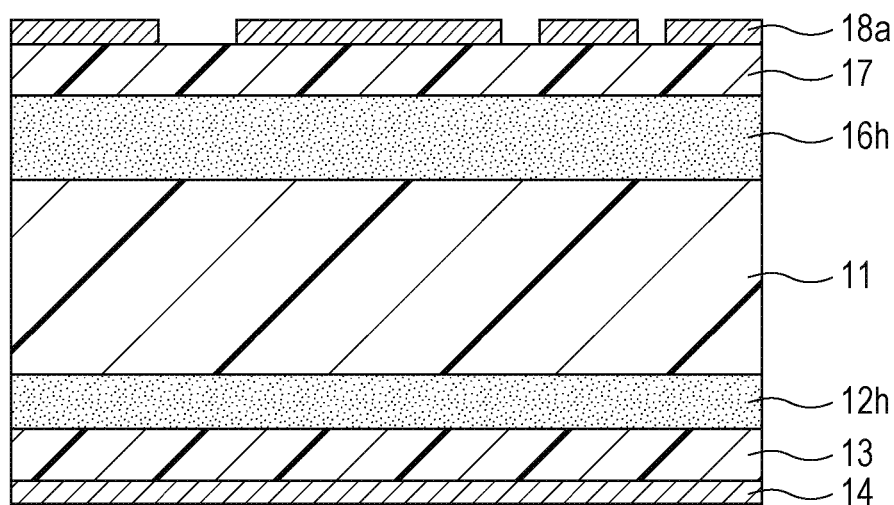
FIG. 4 is a cross-sectional view for explaining a step of forming the substrate for flexible printed wiring board according to a second embodiment, following FIG. 3.

First, the substrate for flexible printed wiring board FPCB1 according to the first embodiment is prepared. Then, as illustrated in FIG. 4, the conductor layer 14 is patterned by a known fabrication technique to form the conductive pattern 18a. The conductive pattern 18a may include the signal line and ground wiring. The signal line and the ground wiring are electrically connected to the signal line for high-speed signal transmission and a ground layer of an outer layer, through the through-hole.

Figure 5:
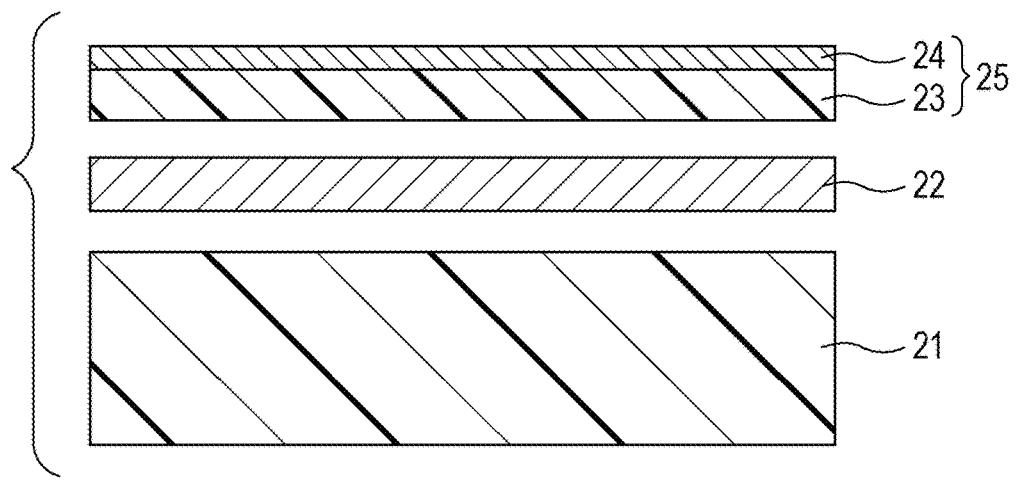
FIG. 5 is a cross-sectional view for explaining a step of forming the substrate for flexible printed wiring board according to the second embodiment, following FIG. 4.

Subsequently, as illustrated in FIG. 5, the fluororesin layer 21, the adhesive layer 22, and a single-sided metal foil-clad laminate 25 are prepared.

The fluororesin layer 21 is not limited to the one-layer film, similarly to the fluororesin layer 11 described above. The fluororesin layer 21 may have the multilayer structure in which a plurality of films is laminated. For example, the fluororesin layer 21 may use the three-layer structure including PFA/PTFE/PFA. Thus, the fluororesin layer 21 and the adhesive layer 22 can be firmly adhered to each other.

The adhesive layer 22 is preferably made of the adhesive having excellent heat resistance, similarly to the adhesive layers 12 and 16 described above. Examples of such an adhesive include various resin-based heat-curable adhesives having excellent dielectric properties, such as a modified polyolefin resin-based adhesive, an epoxy resin-based adhesive, a butyral resin-based adhesive, a bismaleimide-based adhesive, a polyimide-based adhesive, a modified polyphenylene ether-based adhesive, or a modified aromatic polyester-based adhesive.

The single-sided metal foil-clad laminate 25 has a structure in which the conductor layer 24 is provided as the metal foil on one side of the reinforcing resin layer 23 that is the insulating layer. As the single-sided metal foil-clad laminate 25, commercially available flexible cupper-clad laminate (FCCL) such as non-adhesive copper-clad laminate ESPANEX (registered trademark) of NIPPON STEEL Functional Material Manufacturing Co., Ltd. may be used.

Figure 6:
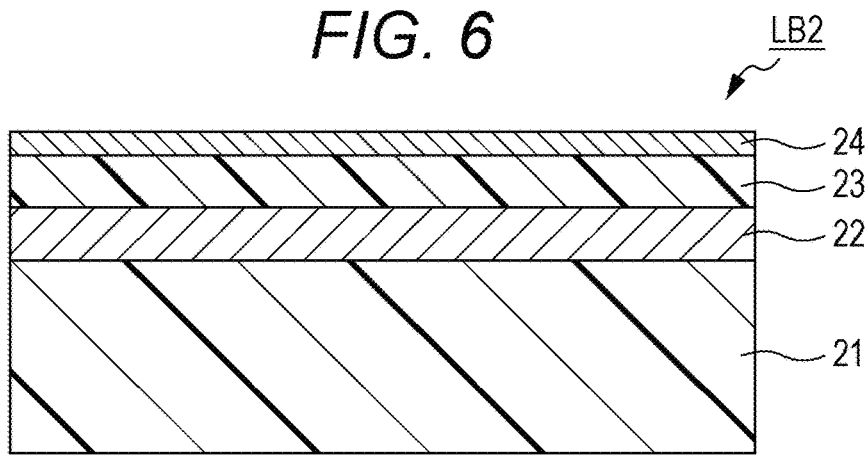
FIG. 6 is a cross-sectional view for explaining a step of forming the substrate for flexible printed wiring board according to the second embodiment, following FIG. 5.
Figure 7:
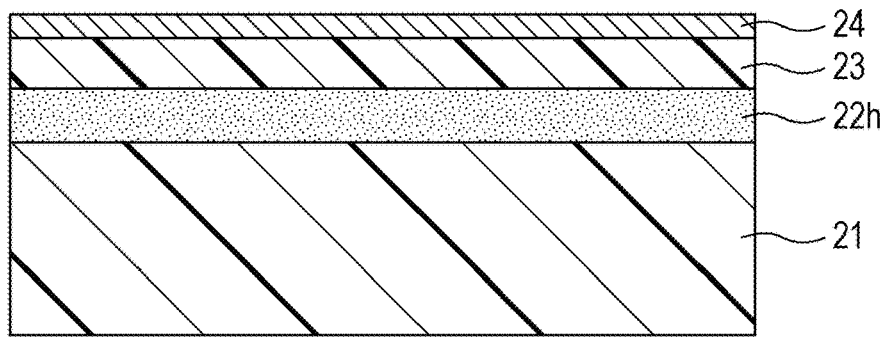
FIG. 7 is a cross-sectional view for explaining a step of forming the substrate for flexible printed wiring board according to the second embodiment, following FIG. 6.

Subsequently, as illustrated in FIGS. 5 and 6, the single-sided metal foil-clad laminate 25 is disposed to overlap the fluororesin layer 21 via the adhesive layer 22 that is the adhesive sheet, and is pressed to form a laminated body LB2. Note that this step is preferably performed as so-called temporary lamination at the temperature (for example, 60 to 80° C.) lower than the glass transition temperature of each resin layer.

Note that when the adhesive sheet is not used as the adhesive layer 22, the laminated body LB2 may be formed by applying the adhesive to the upper surface of the fluororesin layer 21 to form the adhesive layer 22, and then bonding the single-sided metal foil-clad laminate 25. Of course, the adhesive may be applied to the reinforcing resin layer 23 to form the adhesive layer 22, and then the single-sided metal foil-clad laminate 25 on which the adhesive layer 22 is formed may be laminated on the upper surface of the fluororesin layer 21.

After forming the laminated body LB2 as described above, as illustrated in FIG. 7, by heating the laminated body LB2, the adhesive layer 22 is cured to be the cured adhesive layer 22h (integration step). More specifically, in this step, the laminated body LB2 is integrated by pressurizing the laminated body LB2 while heating the laminated body LB2 at a curing temperature or higher of the adhesive layer 22.

Figure 8:
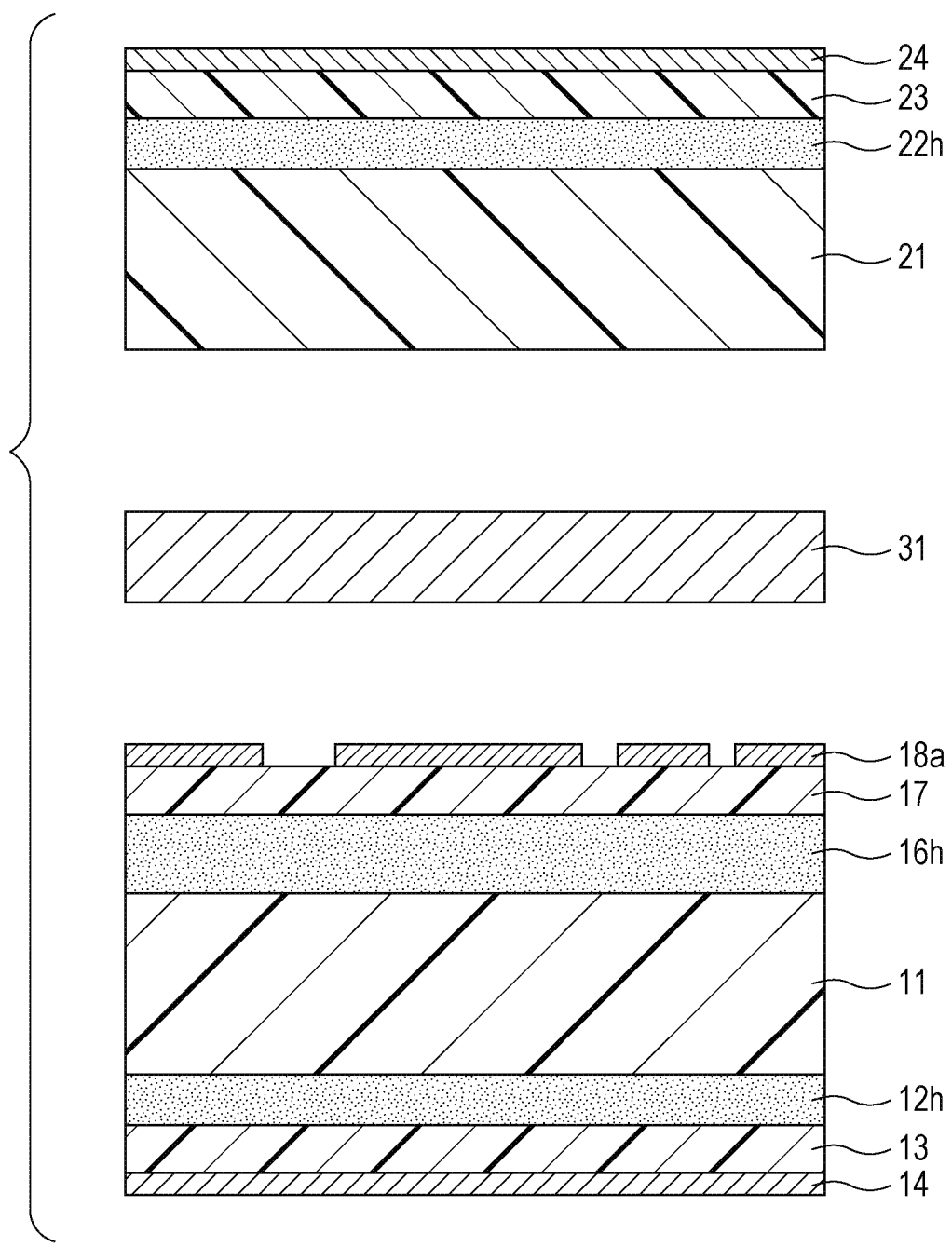
FIG. 8 is a cross-sectional view for explaining a step of forming the substrate for flexible printed wiring board according to the second embodiment, following FIG. 7.
Figure 9:
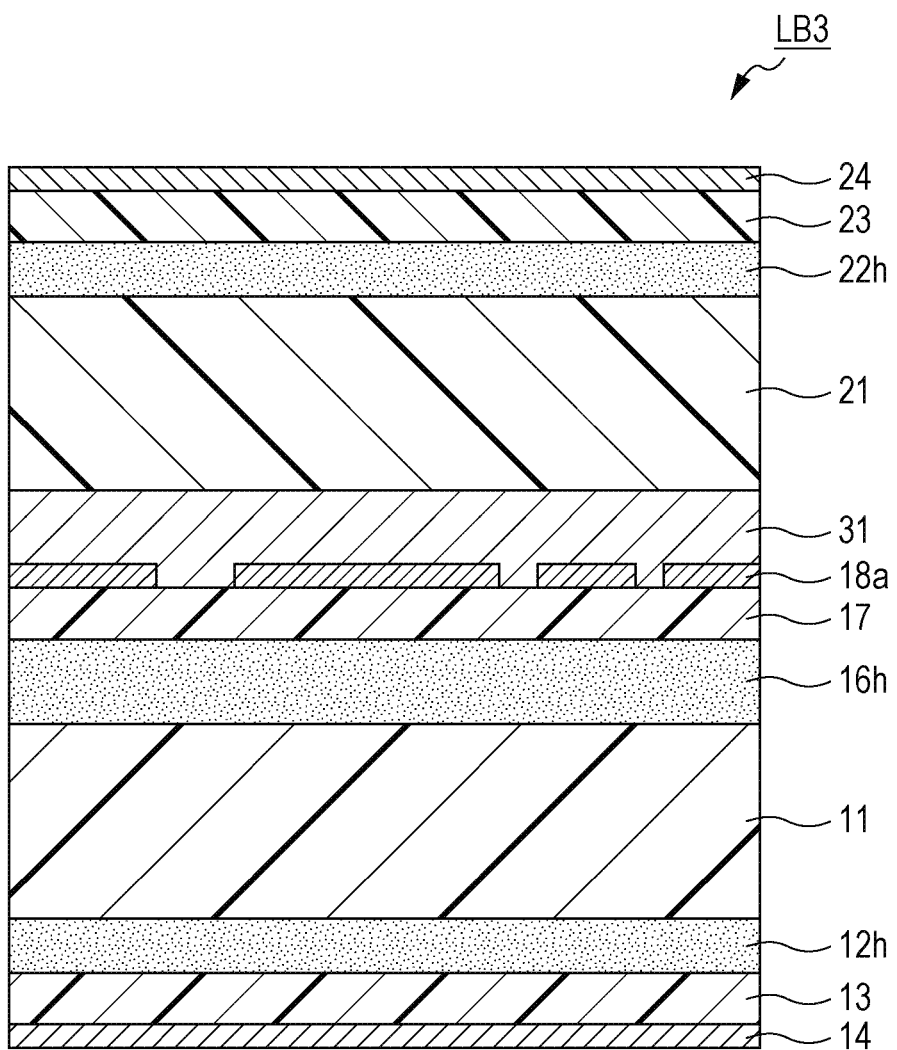
FIG. 9 is a cross-sectional view for explaining a step of forming the substrate for flexible printed wiring board according to the second embodiment, following FIG. 8.

Next, as illustrated in FIGS. 8 and 9, a laminated body LB3 is formed by laminating the heat-treated (integrated) laminated body LB1 (substrate for flexible printed wiring board FPCB1) and the heat-treated (integrated) laminated body LB2 via the adhesive layer 31. Specifically, the laminated body LB3 is formed by laminating the laminated body LB1 and the laminated body LB2 via the adhesive layer 31 so that the conductive pattern 18a of the laminated body LB1 and the fluororesin layer 21 of the laminated body LB2 face each other. The thickness of the adhesive layer 31 is such that the conductive pattern 18a can be embedded, and the thickness of the adhesive layer 31 excluding the conductive pattern 18a is set to a thickness that can secure 10 μm or more.

The adhesive layer 31 is preferably made of the adhesive having excellent heat resistance, similarly to the adhesive layers 12, 16, and 22 described above. Examples of such an adhesive include various resin-based heat-curable adhesives having excellent dielectric properties, such as a modified polyolefin resin-based adhesive, an epoxy resin-based adhesive, a butyral resin-based adhesive, a bismaleimide-based adhesive, a polyimide-based adhesive, a modified polyphenylene ether-based adhesive, or a modified aromatic polyester-based adhesive.

Note that when the adhesive sheet is not used as the adhesive layer 31, the adhesive may be applied to the lower surface of the fluororesin layer 21 to form the adhesive layer 31, and then the adhesive layer 31 may be bonded to the substrate for flexible printed wiring board FPCB1. Alternatively, the adhesive may be applied to the reinforcing resin layer 17 so as to embed the conductive pattern 18a to form the adhesive layer 31, and then the adhesive layer 31 may be bonded to the laminated body LB2 illustrated in FIG. 7.

Subsequently, the adhesive layer 31 is cured by heating the laminated body LB3, so as to be the cured adhesive layer 31h. Thus, the substrate for flexible printed wiring board FPCB2 according to the second embodiment illustrated in FIG. 10 can be obtained.

Note that in the above manufacturing method, a surface-treated fluororesin layer 21 may be used as the fluororesin layer 21. For example, the bonding surface (main surface) of the fluororesin layer 21 is surface-modified, and then is laminated with the single-sided metal foil-clad laminate 25 via the adhesive layer 22, so that it is possible to secure the adhesive strength after the integration step. In this case, a commercially available fluororesin film that has been subjected to the surface modification treatment can be used as the fluororesin layer 21.

Further, in the above manufacturing method, the single-sided metal foil-clad laminate 25 is used, but instead of the single-sided metal foil-clad laminate 25, the reinforcing resin layer 23 and the conductor layer 24 may be sequentially laminated on the adhesive layer 22.

<Method for Forming Through-Hole>

Hereinafter, the method for forming the through-hole in the substrate for flexible printed wiring board FPCB2 will be described with reference to FIGS. 11 to 13.

Figure 11:
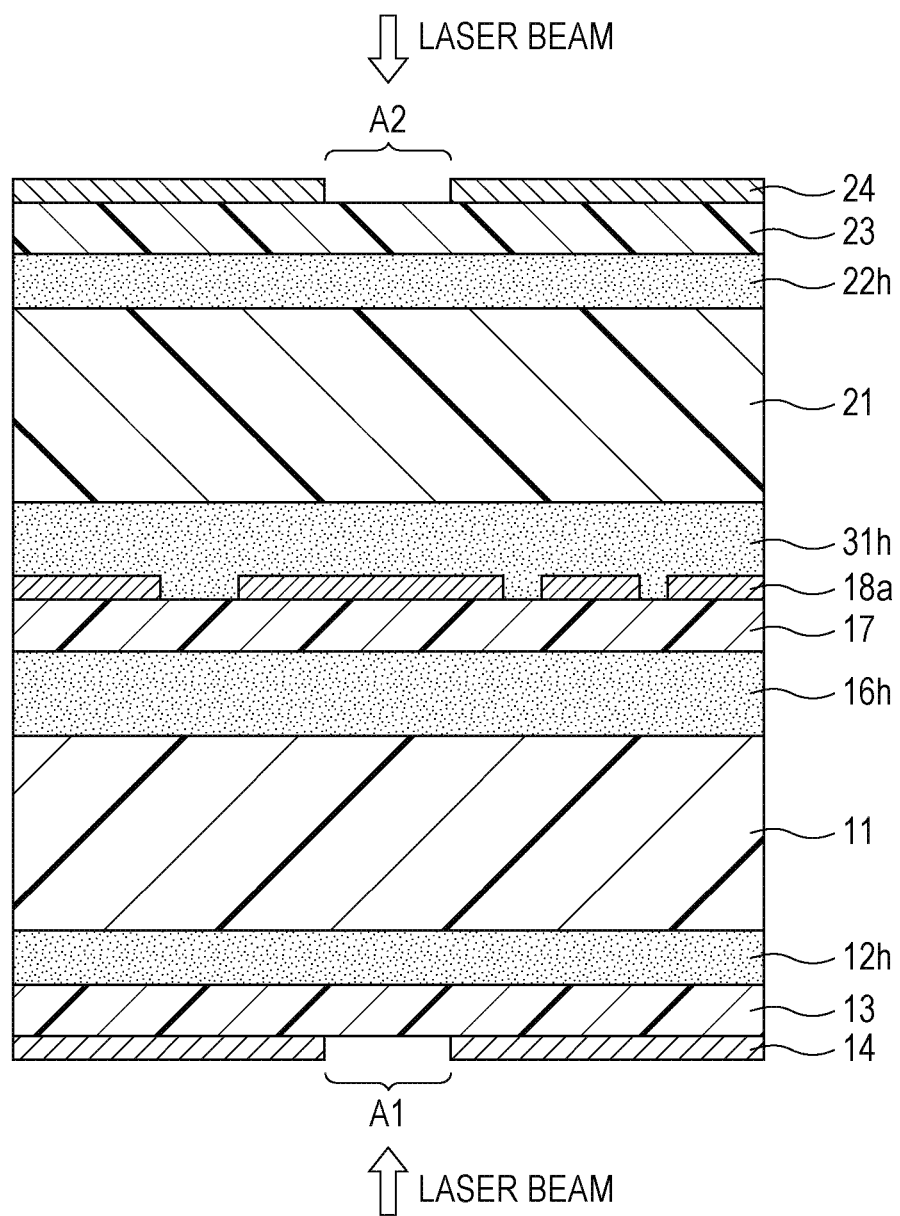
FIG. 11 is a cross-sectional view for explaining a step of forming a through-hole in the substrate for flexible printed wiring board according to the second embodiment.

As illustrated in FIG. 11, the conductor layer 14 is patterned by the known fabrication technique to form a conformal mask having an opening A1. Similarly, the conductor layer 24 is patterned to form a conformal mask having an opening A2.

Figure 12:
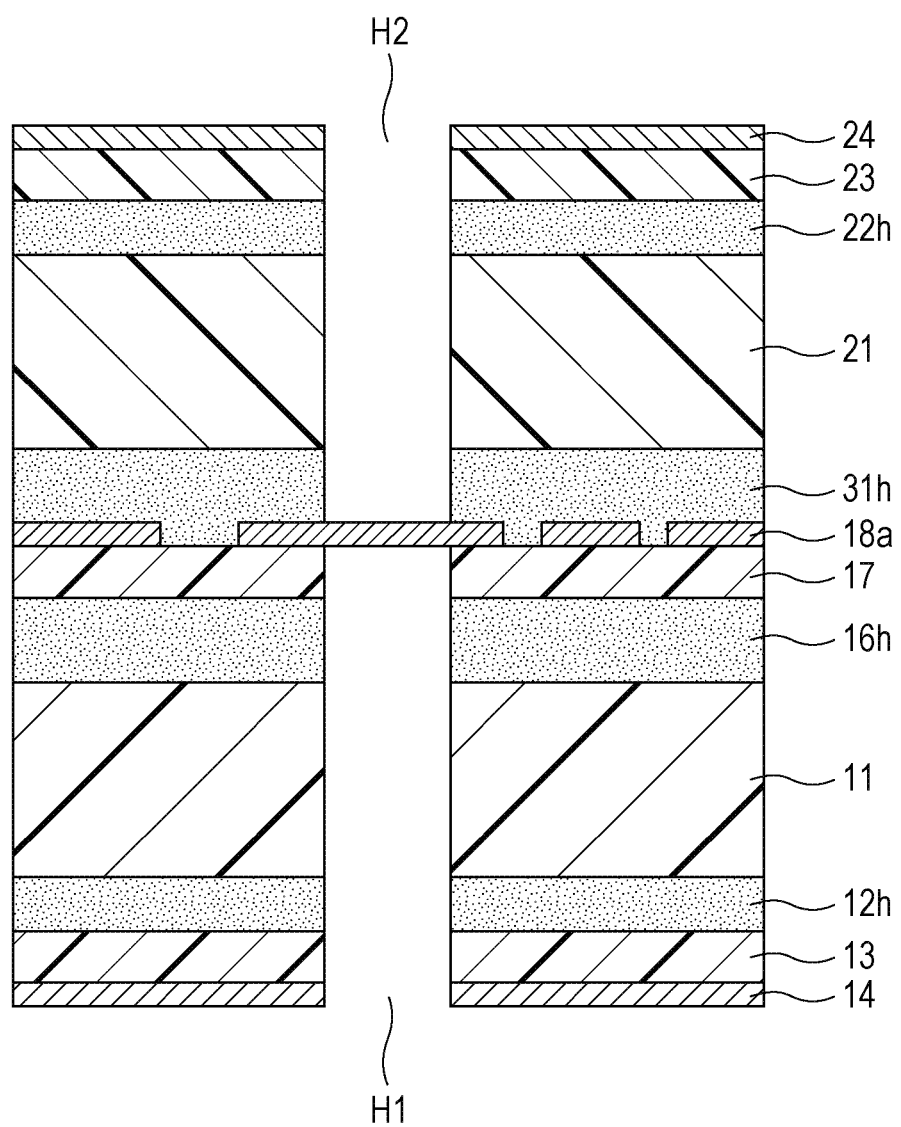
FIG. 12 is a cross-sectional view for explaining a step of forming the through-hole in the substrate for flexible printed wiring board according to the second embodiment, following FIG. 11.

Subsequently, as illustrated in FIGS. 11 and 12, by irradiating the opening A1 of the conductor layer 14 with the laser beam, the reinforcing resin layer 13, the cured adhesive layer 12h, the fluororesin layer 11, the cured adhesive layer 16h, and the reinforcing resin layer 17 are removed to form the conduction hole H1. The conduction hole H1 is a bottomed hole, and the conductive pattern 18a (conductor layer 18) is exposed on a bottom surface of the hole. Similarly, by irradiating the opening A2 of the conductor layer 24 with the laser beam, the reinforcing resin layer 23, the cured adhesive layer 22h, the fluororesin layer 21, and the cured adhesive layer 31h are removed to form the conduction holes H2. The conduction hole H2 is a bottomed hole, and the conductive pattern 18a is exposed on the bottom surface of the hole. Perforating steps of the conduction holes H1 and H2 are performed, for example, by irradiating the openings A1 and A2 with laser beam pulses a plurality of times.

Figure 13:
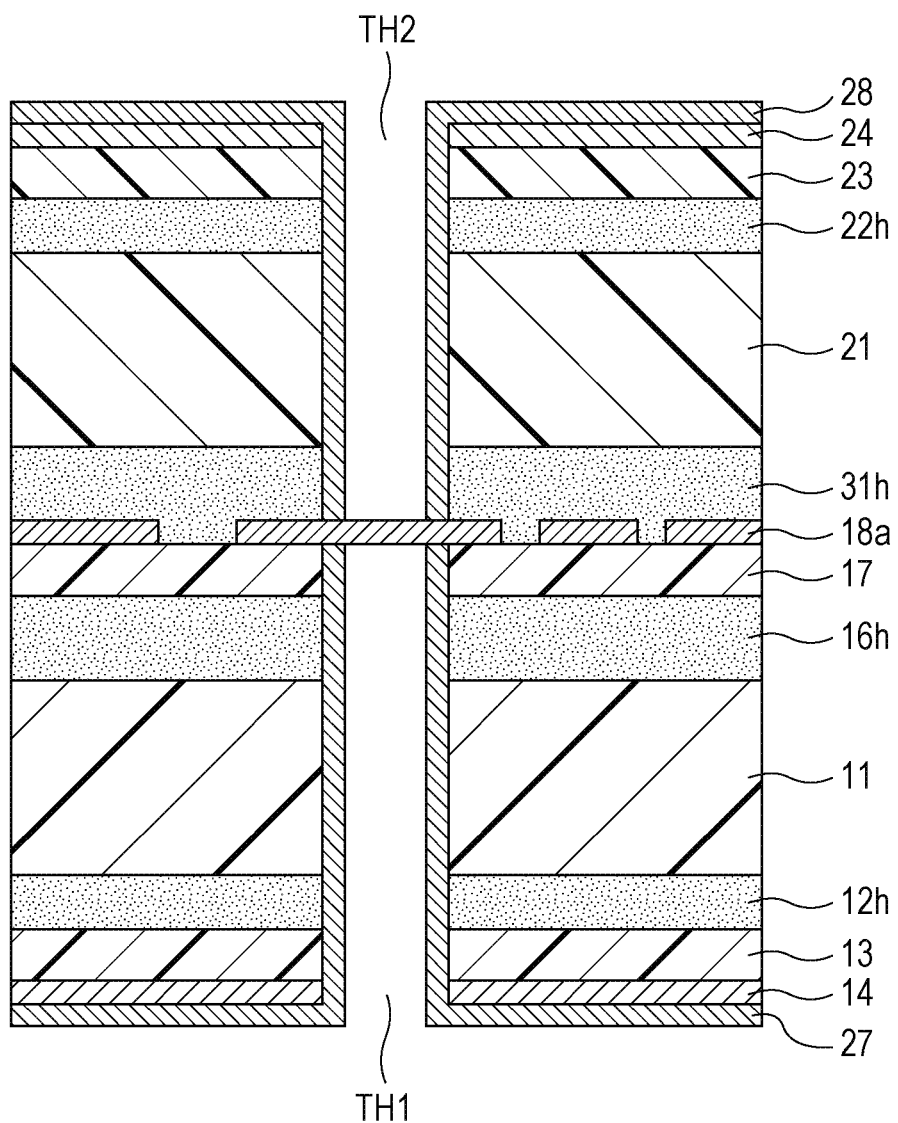
FIG. 13 is a cross-sectional view for explaining a step of forming the through-hole in the substrate for flexible printed wiring board according to the second embodiment, following FIG. 12.

Subsequently, after performing the desmear processing, as illustrated in FIG. 13, by forming a plating layer 27 on an inner wall of the conduction hole H1, a through-hole TH1 that electrically connects the conductor layer 14 and the conductive pattern 18a (conductor layer 18) is formed. Similarly, by forming a plating layer 28 on an inner wall of the conduction hole H2, a through-hole TH2 that electrically connects the conductor layer 24 and the conductive pattern 18a is formed.

As described above, the thermal decomposition temperature of the cured adhesive layer 16h is lower than the thermal decomposition temperatures of the reinforcing resin layers 13, 17, and 23, and the thickness of the cured adhesive layer 16h is 10 µm or more. Therefore, in a laser processing step of perforating the conduction hole H1, the recess generated in the cured adhesive layer 16h is relatively shallow. This is because a volume of the recess formed on the cured adhesive layer 16h (that is, an amount of the cured adhesive that melts and decomposes by laser beam irradiation) is substantially constant regardless of the thickness of the cured adhesive layer 16h (the volume of the recess depends on the number of irradiations of the laser beam pulses), and because the thermal decomposition temperature of the cured adhesive layer 16h is relatively low, the cured adhesive layer 16h is melted and decomposed over the entire thickness direction. Therefore, as the cured adhesive layer 16h is thicker, the depth (horizontal length) of the recess is smaller. As described above, according to the present embodiment, an aspect ratio of the recess (a ratio of the depth to the width of the recess) generated in the cured adhesive layer 16h can be reduced.

Since the aspect ratio of the recess generated in the cured adhesive layer 16h is low as described above, the recess is filled with the plating metal in the plating step. As a result, the generation of the void after the formation of through-hole TH1 can be suppressed.

The cured adhesive layer 31h is the same as the cured adhesive layer 16h described above. That is, since the thermal decomposition temperature of the cured adhesive layer 31h is lower than the thermal decomposition temperatures of the reinforcing resin layers 13, 17, and 23, and the thickness of the cured adhesive layer 31h excluding the thickness of the conductive pattern 18a is 10 µm or more, the aspect ratio of the recess generated in the cured adhesive layer 31h is reduced. As a result, the generation of the void after the formation of through-hole TH2 can be suppressed.

Note that as a matter of course, it is also possible to form the through-hole that electrically connects the conductor layer 14 and the conductor layer 18 (conductive pattern 18a) in the same manner as in the above method for the substrate for flexible printed wiring board FPCB1 according to the first embodiment.

Figure 14:
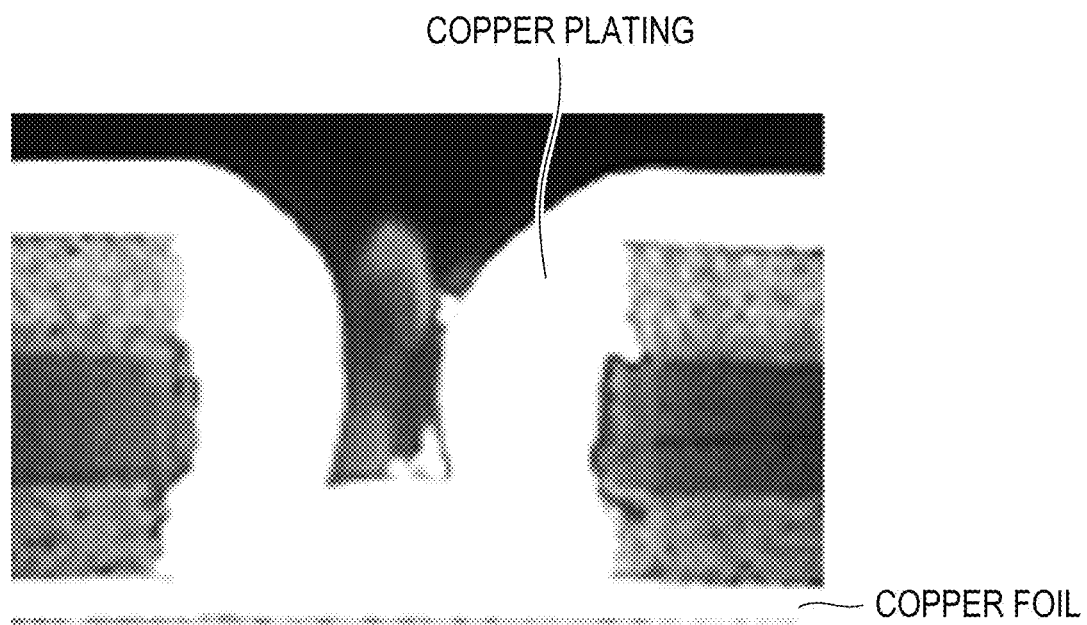
FIG. 14 is a cross-sectional photograph of the through-hole formed in the substrate for flexible printed wiring board according to an example.

FIG. 14 illustrates a cross-sectional photograph of the through-hole actually formed as an example. In this example, a copper plating layer is formed after forming the through-hole in a substrate having the same configuration as the substrate for flexible printed wiring board FPCB1 according to the first embodiment. PFA having a thickness of 50 µm is used as the fluororesin layer 11, LCP having a thickness of 25 µm is used as the reinforcing resin layers 13 and 17, and a copper foil having a thickness of about 12 µm is used as the conductor layers 14 and 18. Further, the thickness of the cured adhesive layer 12h is 30 µm, and the thickness of the cured adhesive layer 16h is 10 µm. As illustrated in FIG. 14, no deep recess is formed in the inner wall of the conduction hole, and no void is generated.

Figure 15:
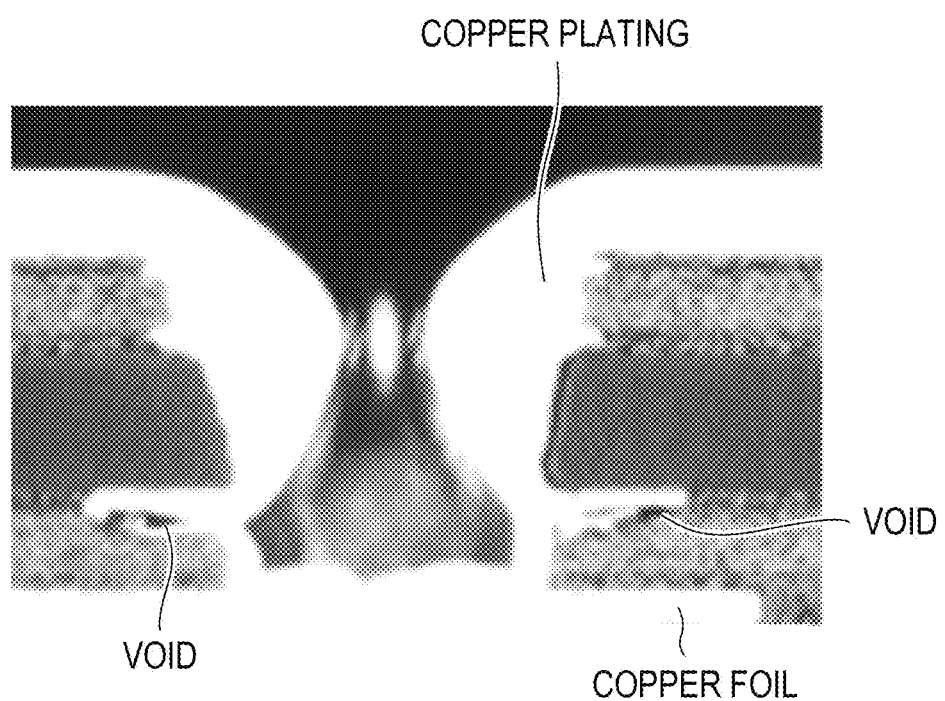
FIG. 15 is a cross-sectional photograph of the through-hole formed in the substrate for flexible printed wiring board according to a comparative example.

FIG. 15 illustrates a cross-sectional photograph of the through-hole actually formed as a comparative example. Difference between the comparative example illustrated in FIG. 15 and the example illustrated in FIG. 14 is the thickness of the cured adhesive layer. In the comparative example, the thickness of the cured adhesive layer corresponding to the cured adhesive layers 12h and 16h is 6 µm. In the comparative example, as illustrated in FIG. 15, since the deep recess is formed in the cured adhesive layer under the fluororesin layer, and the deep recess cannot be filled with copper plating, the void is generated as a result. Note that the recess of the cured adhesive layer over the fluororesin layer is shallow, and no void is generated. It is considered that this is because the cured adhesive layer 12h over the fluororesin layer is already penetrated when the fluororesin layer is perforated, so that it is not so affected by the laser beam irradiation. In contrast, it is considered that since the cured adhesive layer under the fluororesin layer continues to receive the laser beam for a relatively long time until the fluororesin layer is penetrated, melting and decomposition of the cured adhesive layer proceed.

Note that if the thermal decomposition temperature of the cured adhesive layer 16h is as high as the thermal decomposition temperature of the reinforcing resin layers 13 and 17, even if the thickness of the cured adhesive layer 16h is secured to be 10 μm or more, local melting and decomposition proceed near the interface with the fluororesin layer while receiving the laser beam. As a result, the deep recess is formed only on an upper portion of the cured adhesive layer 16h (near the interface with the fluororesin layer). Therefore, it is preferred that the cured adhesive layers 16h and 31h have a secured thickness of 10 μm or more and a thermal decomposition temperature not as high as the thermal decomposition temperature of the reinforcing resin layer. With this configuration, the inner wall of the cured adhesive layer is scraped in a gentle bow shape over the entire thickness direction. As a result, since the recess having a high aspect ratio is not formed, it is possible to avoid the generation of the void in the plating step.

Based on the above description, one of ordinary skill in the art may be able to conceive additional effects and various modifications of the present disclosure. However, aspects of the present disclosure are not limited to the embodiments described above. Various additions, changes and partial deletions can be made without departing from the conceptual idea and spirit of the techniques of the present disclosure derived from the claims and their equivalents.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for forming a through-hole, comprising:
   forming a laminated body including a fluororesin layer having a first main surface and a second main surface, a first adhesive layer provided on the first main surface, a first reinforcing resin layer provided on the first adhesive layer and having a linear expansion coefficient smaller than that of the fluororesin layer, a first conductor layer provided directly or indirectly on the first reinforcing resin layer, a second adhesive layer provided on the second main surface, a second reinforcing resin layer provided on the second adhesive layer and having a linear expansion coefficient smaller than that of the fluororesin layer, and a second conductor layer provided directly or indirectly on the second reinforcing resin layer;
   heating the laminated body to cure the first adhesive layer and the second adhesive layer, to be respectively a first cured adhesive layer and a second cured adhesive layer;
   forming an opening in the first conductor layer and irradiating the opening with a laser beam to remove the first reinforcing resin layer, the first cured adhesive layer, the fluororesin layer, the second cured adhesive layer, and the second reinforcing resin layer, to form a bottomed conduction hole with the second conductor layer exposed on a bottom surface of the conduction hole; and
   forming a plating layer on an inner wall of the conduction hole to electrically connect the first conductor layer and the second conductor layer, wherein
   a thermal decomposition temperature of the second cured adhesive layer is lower than those of the first reinforcing resin layer and the second reinforcing resin layer, and a thickness of the second cured adhesive layer is 10 μm or more and 200 μm or less.

2. The method for forming the through-hole according to claim 1, wherein the thickness of the second cured adhesive layer is 20 μm or more and 100 μm or less.

3. The method for forming the through-hole according to claim 1, wherein the second adhesive layer is made of a modified polyolefin resin-based adhesive, an epoxy resin-based adhesive, a butyral resin-based adhesive, a bismaleimide-based adhesive, a polyimide-based adhesive, a modified polyphenylene ether-based adhesive, or a modified aromatic polyester-based adhesive.

4. The method for forming the through-hole according to claim 1, further comprising:
   patterning the second conductor layer to form a conductive pattern;
   forming a second laminated body including a second fluororesin layer having a third main surface and a fourth main surface, a third adhesive layer provided on the third main surface, a third reinforcing resin layer provided on the third adhesive layer and having a linear expansion coefficient smaller than that of the second fluororesin layer, and a third conductor layer provided directly or indirectly on the third reinforcing resin layer;
   heating the second laminated body to cure the third adhesive layer, to be a third cured adhesive layer;
   forming a third laminated body by laminating the laminated body and the second laminated body via a fourth adhesive layer so that the conductive pattern of the heated laminated body and the second fluororesin layer of the heated second laminated body face each other;
   heating the third laminated body to cure the fourth adhesive layer, to be a fourth cured adhesive layer;
   forming an opening in the third conductor layer;
   irradiating the opening of the third conductor layer with the laser beam to remove the third reinforcing resin layer, the third cured adhesive layer, the second fluororesin layer, and the fourth cured adhesive layer, to form a bottomed second conduction hole with the conductive pattern exposed on a bottom surface of the second conduction hole; and
   forming a plating layer on an inner wall of the second conduction hole to electrically connect the third conductor layer and the conductive pattern, wherein
   the thermal decomposition temperature of the fourth cured adhesive layer is lower than those of the first reinforcing resin layer, the second reinforcing resin layer, and the third reinforcing resin layer, and the thickness of the fourth cured adhesive layer excluding the thickness of the conductive pattern is 10 μm or more and 200 μm or less.

5. A substrate for flexible printed wiring board comprising:
   a fluororesin layer having a first main surface and a second main surface opposite to the first main surface;
   a first cured adhesive layer provided on the first main surface of the fluororesin layer;
   a first reinforcing resin layer provided on the first cured adhesive layer and having a linear expansion coefficient smaller than that of the fluororesin layer;

a first conductor layer provided directly or indirectly on the first reinforcing resin layer;

a second cured adhesive layer provided on the second main surface of the fluororesin layer;

a second reinforcing resin layer provided on the second cured adhesive layer and having a linear expansion coefficient smaller than that of the fluororesin layer;

a second conductor layer provided directly or indirectly on the second reinforcing resin layer; and a through-hole electrically connects the first conductor layer and the second conductor layer, a thermal decomposition temperature of the second cured adhesive layer is lower than those of the first reinforcing resin layer and the second reinforcing resin layer, and a thickness of the second cured adhesive layer is 10 µm or more and 200 µm or less.

6. The substrate for flexible printed wiring board according to claim 5, wherein the first conductor layer is provided directly on the first reinforcing resin layer without using an adhesive layer.

7. The substrate for flexible printed wiring board according to claim 5, wherein the second conductor layer is provided directly on the second reinforcing resin layer without using an adhesive layer.

8. The substrate for flexible printed wiring board according to claim 5, wherein the thickness of the second cured adhesive layer is 20 µm or more and 100 µm or less.

9. The substrate for flexible printed wiring board according to claim 5, wherein the first reinforcing resin layer and the second reinforcing resin layer have a linear expansion coefficient of 30 ppm/° C. or less and an elastic modulus of 3 GPa or more.

10. The substrate for flexible printed wiring board according to claim 5, wherein the first cured adhesive layer has a thickness different from a thickness of the second cured adhesive layer.

11. A substrate for flexible printed wiring board comprising:

a first fluororesin layer having a first main surface and a second main surface opposite to the first main surface;

a first cured adhesive layer provided on the first main surface of the first fluororesin layer;

a first reinforcing resin layer provided on the first cured adhesive layer and having a linear expansion coefficient smaller than that of the first fluororesin layer;

a first conductor layer provided directly or indirectly on the first reinforcing resin layer;

a second cured adhesive layer provided on the second main surface of the first fluororesin layer;

a second reinforcing resin layer provided on the second cured adhesive layer and having a linear expansion coefficient smaller than that of the first fluororesin layer;

a conductive pattern provided directly or indirectly on the second reinforcing resin layer;

a second fluororesin layer having a third main surface facing the conductive pattern and a fourth main surface opposite to the third main surface;

a third cured adhesive layer embedding the conductive pattern, and adhering the second reinforcing resin layer and the second fluororesin layer;

a fourth cured adhesive layer provided on the fourth main surface of the second fluororesin layer;

a third reinforcing resin layer provided on the fourth cured adhesive layer and having a linear expansion coefficient smaller than that of the second fluororesin layer; and a second conductor layer provided directly or indirectly on the third reinforcing resin layer, wherein thermal decomposition temperatures of the second cured adhesive layer and the third cured adhesive layer are lower than those of the first reinforcing resin layer, the second reinforcing resin layer, and the third reinforcing resin layer, a thickness of the second cured adhesive layer is 10 µm or more and 200 µm or less, and a thickness of the third cured adhesive layer excluding a thickness of the conductive pattern is 10 µm or more and 200 µm or less.

12. The substrate for flexible printed wiring board according to claim 11, wherein the first conductor layer is provided directly on the first reinforcing resin layer without using an adhesive layer.

13. The substrate for flexible printed wiring board according to claim 11, wherein the second conductor layer is provided directly on the third reinforcing resin layer without using an adhesive layer.

14. The substrate for flexible printed wiring board according to claim 11, wherein the conductive pattern is provided directly on the second reinforcing resin layer without using an adhesive layer.

15. The substrate for flexible printed wiring board according to claim 11, wherein the thickness of the second cured adhesive layer, and the thickness of the third cured adhesive layer excluding the thickness of the conductive pattern are 20 µm or more and 100 µm or less.

16. The substrate for flexible printed wiring board according to claim 11, wherein the first reinforcing resin layer, the second reinforcing resin layer, and the third reinforcing resin layer have a linear expansion coefficient of 30 ppm/° C. or less and an elastic modulus of 3 GPa or more.

* * * * *